(12) United States Patent
Sriram

(10) Patent No.: US 7,297,580 B2
(45) Date of Patent: Nov. 20, 2007

(54) METHODS OF FABRICATING TRANSISTORS HAVING BURIED P-TYPE LAYERS BENEATH THE SOURCE REGION

(75) Inventor: Saptharishi Sriram, Cary, NC (US)

(73) Assignee: Cree, Inc., Durham, NC (US)

( * ) Notice: Subject to any disclaimer, the term of this patent is extended or adjusted under 35 U.S.C. 154(b) by 247 days.

(21) Appl. No.: 11/142,551

(22) Filed: Jun. 1, 2005

(65) Prior Publication Data

US 2005/0224809 A1    Oct. 13, 2005

Related U.S. Application Data

(62) Division of application No. 10/304,272, filed on Nov. 26, 2002, now Pat. No. 6,956,239.

(51) Int. Cl.
*H01L 21/338* (2006.01)

(52) U.S. Cl. ............... 438/167; 438/169; 438/172; 438/174; 438/192; 438/194; 257/279; 257/280; 257/287; 257/288; 257/E21.451

(58) Field of Classification Search ............... 438/174, 438/192, 194; 257/E21.451, 279, 280, 287, 257/288
See application file for complete search history.

(56) References Cited

U.S. PATENT DOCUMENTS

| | | |
|---|---|---|
| 3,903,592 A | 9/1975 | Heckl |
| 4,732,871 A | 3/1988 | Buchmann et al. |
| 4,737,469 A | 4/1988 | Stevens |
| 4,757,028 A | 7/1988 | Kondoh et al. |
| 4,762,806 A | 8/1988 | Suzuki et al. |
| 4,803,526 A | 2/1989 | Terada et al. |
| 4,897,710 A | 1/1990 | Suzuki et al. |
| 4,947,218 A | 8/1990 | Edmond et al. |
| 5,229,625 A | 7/1993 | Suzuki et al. |
| 5,264,713 A | 11/1993 | Palmour |
| 5,270,554 A | 12/1993 | Palmour |
| 5,289,015 A | 2/1994 | Chirovsky et al. |

(Continued)

FOREIGN PATENT DOCUMENTS

DE    19900169    7/1999

(Continued)

OTHER PUBLICATIONS

*A 10 W 2 GHz Silicon Carbide MESFET*, Microwave Journal, Sep. 1999, pp. 232, 240, 242.

(Continued)

*Primary Examiner*—Scott B. Geyer
*Assistant Examiner*—Kyoung Lee
(74) *Attorney, Agent, or Firm*—Myers Bigel Sibley & Sajovec PA

(57) ABSTRACT

The present invention provides a unit cell of a metal-semiconductor field-effect transistor (MESFET). The unit cell of the MESFET includes a source, a drain and a gate. The gate is disposed between the source and the drain and on an n-type conductivity channel layer. A p-type conductivity region is provided beneath the source and has an end that extends towards the drain. The p-type conductivity region is spaced apart from the n-type conductivity channel region and is electrically coupled to the source.

36 Claims, 11 Drawing Sheets

U.S. PATENT DOCUMENTS

| | | | |
|---|---|---|---|
| 5,300,795 A * | 4/1994 | Saunier et al. | 257/192 |
| 5,306,650 A | 4/1994 | O'Mara, Jr. et al. | |
| 5,396,085 A | 3/1995 | Baliga | |
| 5,399,883 A | 3/1995 | Baliga | |
| 5,510,630 A | 4/1996 | Agarwal et al. | |
| 5,686,737 A | 11/1997 | Allen | |
| 5,719,409 A | 2/1998 | Singh et al. | |
| 5,742,082 A | 4/1998 | Martinez et al. | |
| 5,869,856 A * | 2/1999 | Kasahara | 257/287 |
| 5,891,769 A * | 4/1999 | Liaw et al. | 438/167 |
| 5,895,939 A | 4/1999 | Ueno | |
| 5,900,648 A | 5/1999 | Harris et al. | |
| 5,925,895 A | 7/1999 | Sriram et al. | |
| 5,972,801 A | 10/1999 | Lipkin et al. | |
| 6,107,649 A | 8/2000 | Zhao | |
| 6,121,633 A | 9/2000 | Singh et al. | |
| 6,218,680 B1 | 4/2001 | Carter, Jr. et al. | |
| 6,316,793 B1 | 11/2001 | Sheppard et al. | |
| 6,686,616 B1 | 2/2004 | Allen et al. | |
| 2003/0017660 A1 | 1/2003 | Li | |
| 2003/0075719 A1 | 4/2003 | Sriram | |
| 2004/0178413 A1 | 9/2004 | Ota | |

FOREIGN PATENT DOCUMENTS

| | | |
|---|---|---|
| EP | 0 518 683 A1 | 12/1992 |
| JP | 47-5124 | 3/1972 |
| JP | 54-155482 | 10/1979 |
| JP | 59-134874 | 8/1984 |
| JP | 60-142568 | 7/1985 |
| JP | 60-154674 | 8/1985 |
| JP | 60189250 A | 9/1985 |
| JP | 63-47983 | 2/1988 |
| JP | 01059961 A | 3/1989 |
| JP | 1-106476 | 4/1989 |
| JP | 1-106477 | 4/1989 |
| JP | 1-196873 | 8/1989 |
| JP | 1-308876 | 12/1989 |
| JP | 2-10772 | 1/1990 |
| JP | 04225534 A | 8/1992 |
| JP | 09036359 | 7/1995 |
| JP | 9-36359 | 2/1997 |
| JP | 11150124 A | 6/1999 |
| WO | WO 98/19342 | 5/1998 |
| WO | WO 01/67521 | 9/2001 |
| WO | WO 01/86727 | 11/2001 |

OTHER PUBLICATIONS

Allen, *Silicon Carbide MESFET's with 2W/mm and 50% P.A.E. at 1.8 GHz*, 1996.
Allen et al. U.S. Appl. No. 09/567,717, filed May 10, 2000.
Browne, Editorial: *The Power and the Glory*, Microwaves & RF, Jul. 1999, p. 17.
Browne, *Top Products of 1999*, Microwaves &RF, Dec. 1999, pp. 223-233.
Browne, *SiC MESFET Delivers 10-W Power at 2GHZ*, Microwaves & RF, Oct. 1999, pp. 138-139.
Carter et al., *Silicon Carbide and Related Materials, 1999, Part 2, Materials Science Forum*, vols. 338-342, pp. 1247-1266 (2000).
Evwaraye et al., "Examination of Electrical and Optical Properties of Vanadium in Bulk n-Type Silicon Carbide," *J. Appl. Phys.* vol. 76, No. 10, 1994.
*First Silicon Carbide Microwave Power Products Are Introduced*, Applied Microwave & Wireless, pp. 104.
Heftman, *Wireless Semi Technology Heads Into New Territory*, Microwaves & RF, Feb. 2000, pp. 31-38.
Hilton et al., *Suppression of Instabilities in 4H-SiC Microwave MESFETs*, 2000 8th IEEE International Symposium.
Hilton et al., *Surface Induced Instabilities in 4H-SiC Microwave MESFETs*, Materials Science Forum, vols. 338-342, 2000, pp. 1251-1254.
International Search Report of PCT/US02/32204, filed Oct. 8, 2002.
International Search Reports of PCT/US01/04957 filed Feb. 15, 2001.
Jonsson et al., *Physical Simulations on the Operations of 4H-SiC Microwave Power Transistors*, Materials Science Forum, vols. 338-342, 2000, pp. 1263-1266.
Kelner et al., *β-SiC MESFET's and Buried-Gate JFET's*, IEEE Electron Device Letters, vol. EDL-8, No. 9, Sep. 1987, pp. 428-430.
Kong et al., *temperature Dependence of the Current-Voltage Characteristics of Metal-Semiconductor Field-Effect Transistors in n-Type β-SiC Grown Via Chemical Vapor Deposition*, Appl. Phys Lett., vol. 51, No. 6, Aug. 10, 1987, pp. 442-444.
Konstantinov et al., *Investigation of Lo-Hi-Lo and Delta-Doped Silicon Carbide Structures*, Mat. Res. Soc. Symp. Proc., vol. 640, 2001, pp. H2.4.1-H2.4.6.
Ma, et al., *High Efficiency LDMOS Power FET for Low Voltage Wireless Communications, 1996 IEEE*.
Nilsson et al., *Characterization of SiC MESFETs on Conducting Substrates*, Materials Science Forum, vols. 338-342, 2000, pp. 1255-1258.
Noblanc et al., *Power Density Comparison Between Microwave Power MESFET's Processed on Conductive and Semi-Insulating Wafer*, Materials Science Forum, vols. 338-342, 2000, pp. 1247-1250.
Palmour et al., *Characterization of Device Parameter sin High-Temperature Metal-Oxide-Semiconductor Field Effect Transistors in β-SiC Thin Films*, J. Appl. Phys, vol. 64, No. 4, Aug. 15, 1988, pp. 2168-2177.
Palmour et al., *High-Temperature Depletion-Mode Metal-Oxide-Semiconductor Field Effect Transistors in Beta-SiC Thin Films*, Appl. Phys. Lett., vol. 51, No. 24, Dec. 14, 1987, pp. 2028-2030.
Palmour et al., *Ultrafast Silicon-Carbide Rectifiers*, Powertechnics Magazine, Aug. 1989, pp. 18-21.
Rorsman et al., *Fabrication, Characterization and Modeling of SiC MESFETs*, Materials Science Forum, vols. 338-342, 2000, pp. 12-59-1262.
*SiC MESFET Drives PCS Base Stations*, Wireless Systems Design, Oct. 1999, pp. 24.
Soares, ed., *GaAs MESFET Circuit Design*, Artech House, 1988, pp. 7-9, 17-18.
Sze, *Physics of Semiconductor Devices, Second Edition*, John Wiley & Sons, 1981, pp. 341-347.
Yokogawa, et al., *Electronic Properties of Nitrogen Delta-Doped Silicon Carbide Layers*, 2001 Materials Research Society, vol. 640, H2.5.6.

* cited by examiner

METHODS OF FABRICATING TRANSISTORS HAVING BURIED P-TYPE LAYERS BENEATH THE SOURCE REGION

RELATED APPLICATION

The present application is a divisional of and claims priority from U. S. application Ser. No. 10/304,272, filed Nov. 26, 2002 now U.S. Pat. No. 6,956,239, entitled "TRANSISTORS HAVING BURIED P-TYPE LAYERS BENEATH THE SOURCE REGION," which is assigned to the assignee of the present application, the disclosure of which is hereby incorporated herein by reference as if set forth fully.

STATEMENT OF GOVERNMENT INTEREST

The present invention was made, at least in part, with support from the Department of the Navy, contract number N39997-99-C-3761. The Government may have certain rights in this invention.

FIELD OF THE INVENTION

The present invention relates to microelectronic devices and more particularly to transistors, for example, metal-semiconductor field-effect transistors (MESFETs).

BACKGROUND OF THE INVENTION

Electrical circuits requiring high power handling capability (>20 watts) while operating at high frequencies such as radio frequencies (500 MHz), S-band (3 GHz) and X-band (10 GHz) have in recent years become more prevalent. Because of the increase in high power, high frequency circuits there has been a corresponding increase in demand for transistors that are capable of reliably operating at radio frequencies and above while still being capable of handling higher power loads. Previously, bipolar transistors and power metal-oxide semiconductor field effect transistors (MOSFETs) have been used for high power applications but the power handling capability of such devices may be limited at higher operating frequencies. Junction field-effect transistors (JFETs) were commonly used for high frequency applications but the power handling capability of previously known JFETs may also be limited.

Recently, metal-semiconductor field effect transistors (MESFETs) have been developed for high frequency applications. The MESFET construction may be preferable for high frequency applications because only majority carriers carry current. The MESFET design may be preferred over current MOSFET designs because the reduced gate capacitance permits faster switching times of the gate input. Therefore, although all field-effect transistors utilize only majority carriers to carry current, the Schottky gate structure of the MESFET may make the MESFET more desirable for high frequency applications.

In addition to the type of structure, and perhaps more fundamentally, the characteristics of the semiconductor material from which a transistor is formed also affects the operating parameters. Of the characteristics that affect a transistor's operating parameters, the electron mobility, saturated electron drift velocity, electric breakdown field and thermal conductivity may have the greatest effect on a transistor's high frequency and high power characteristics.

Electron mobility is the measurement of how rapidly an electron is accelerated to its saturated velocity in the presence of an electric field. In the past, semiconductor materials which have a high electron mobility were preferred because more current could be developed with a lesser field, resulting in faster response times when a field is applied. Saturated electron drift velocity is the maximum velocity that an electron can obtain in the semiconductor material. Materials with higher saturated electron drift velocities are preferred for high frequency applications because the higher velocity translates to shorter times from source to drain.

Electric breakdown field is the field strength at which breakdown of the Schottky junction and the current through the gate of the device suddenly increases. A high electric breakdown field material is preferred for high power, high frequency transistors because larger electric fields generally can be supported by a given dimension of material. Larger electric fields allow for faster transients as the electrons can be accelerated more quickly by larger electric fields than by smaller.

Thermal conductivity is the ability of the semiconductor material to dissipate heat. In typical operations, all transistors generate heat. In turn, high power and high frequency transistors usually generate larger amounts of heat than small signal transistors. As the temperature of the semiconductor material increases, the junction leakage currents generally increase and the current through the field effect transistor generally decreases due to a decrease in carrier mobility with an increase in temperature. Therefore, if the heat is dissipated from the semiconductor, the material will remain at a lower temperature and be capable of carrying larger currents with lower leakage currents.

In the past, high frequency MESFETs have been manufactured of n-type III-V compounds, such as gallium arsenide (GaAs) because of their high electron mobilities. Although these devices provided increased operating frequencies and moderately increased power handling capability, the relatively low breakdown voltage and the lower thermal conductivity of these materials have limited their usefulness in high power applications.

Silicon carbide (SiC) has been known for many years to have excellent physical and electronic properties which should theoretically allow production of electronic devices that can operate at higher temperatures, higher power and higher frequency than devices produced from silicon (Si) or GaAs. The high electric breakdown field of about $4\times10^6$ V/cm, high saturated electron drift velocity of about $2.0\times10^7$ cm/sec and high thermal conductivity of about 4.9 W/cm-° K. indicate that SiC would be suitable for high frequency, high power applications. Unfortunately, difficulty in manufacturing has limited the usefulness of SiC for high power and high frequency applications.

MESFETs have been produced having channel layers of silicon carbide have been produced on silicon substrates (See, e.g., U.S. Pat. No. 4,762,806 to Suzuki et al. and U.S. Pat. No. 4,757,028 to Kondoh et al.). Because the semiconductor layers of a MESFET are epitaxial, the layer upon which each epitaxial layer is grown affects the characteristics of the device. Thus, a SiC epitaxial layer grown on a Si substrate generally has different electrical and thermal characteristics then a SiC epitaxial layer grown on a different substrate. Although the SiC on Si substrate devices described in U.S. Pat. Nos. 4,762,806 and 4,757,028 may have exhibited improved thermal characteristics, the use of a Si substrate generally limits the ability of such devices to dissipate heat. Furthermore, the growth of SiC on Si generally results in defects in the epitaxial layers that result in high leakage current when the device is in operation.

Other MESFETs have been developed using SiC substrates. U.S. patent application Ser. No. 07/540,488 filed Jun. 19, 1990 and now abandoned, the disclosure of which is incorporated entirely herein by reference, describes a SiC MESFET having epitaxial layers of SiC grown on a SiC substrate. These devices exhibited improved thermal characteristics over previous devices because of the improved crystal quality of the epitaxial layers grown on SiC substrates. However, to obtain high power and high frequency it may be necessary to overcome the limitations of SiC's lower electron mobility.

Similarly, commonly assigned U.S. Pat. No. 5,270,554 to Palmour describes a SiC MESFET having source and drain contacts formed on $n^+$ regions of SiC and an optional lightly doped epitaxial layer between the substrate and the n-type layer in which the channel is formed. U.S. Pat. No. 5,925,895 to Sriram et al. also describes a SiC MESFET and a structure that is described as overcoming "surface effects" which may reduce the performance of the MESFET for high frequency operation. Sriram et al. also describes SiC MESFETs which use $n^+$ source and drain contact regions as well as a p-type buffer layer.

Furthermore, conventional SiC FET structures may provide the constant characteristics during the entire operating range of the FET, i.e. from fully open channel to near pinch-off voltage, by using a very thin, highly doped channel (a delta doped channel) offset from the gate by a lightly doped region of similar conductivity type. Delta doped channels are discussed in detail in an article by Yokogawa et al. entitled *Electronic Properties of Nitrogen Delta-Doped Silicon Carbide Layers*, MRS Fall Symposium, 2000 and an article by Konstantinov et al. entitled *Investigation of Lo-Hi-Lo and Delta Doped Silicon Carbide Structure*, MRS Fall Symposium, 2000. However, further improvements may be made in SiC MESFETs.

For example, it may be important that SiC MESFETs have high breakdown voltages and relatively low leakage currents if they are used in high efficiency, high power, high linearity radio frequency (RF) applications. In an attempt to provide high breakdown voltages, devices have been provided having highly compensated substrates, such as Vanadium doped semi-insulating SiC. These devices typically provide adequate breakdown voltages as well as low leakage currents, but may sacrifice device performance due to unwanted trapping effects in the substrate. Furthermore, devices having highly doped p-type layers under the channel of the FET have been provided and have been successful in providing good electron confinement and low leakage currents. However, these devices generally contain excessive parasitics that may degrade the RF performance of the device. Accordingly, further improvements may be made with respect to existing SiC FET devices such that they may provide improved breakdown voltages without sacrificing other performance characteristics of the device.

SUMMARY OF THE INVENTION

Embodiments of the present invention provide a unit cell of a metal-semiconductor field-effect transistor (MESFET). The unit cell of the MESFET includes a MESFET having a source, a drain and a gate. The gate is disposed between the source and the drain and on an n-type conductivity channel layer. A p-type conductivity region is provided beneath the source and has an end that extends towards the drain. The p-type conductivity region is spaced apart from the n-type conductivity channel layer and is electrically coupled to the source.

In some embodiments of the present invention, the gate may extend into the n-type conductivity channel layer. The gate may have a first sidewall and a second sidewall. The first sidewall of the gate may be associated with the source side of the gate and the second sidewall may be associated with the drain side of the gate. The p-type conductivity region may extend from beneath the source to the first sidewall of the gate without extending past the first sidewall of the gate, from beneath the source to the second sidewall of the gate without extending past the second sidewall of the gate or from beneath the source to between the first and second sidewalls of the gate. In some embodiments, the p-type conductivity region extends from beneath the source to within about 0.1 to about 0.3 µm of the first sidewall on the source side of the first sidewall. In certain embodiments, the p-type conductivity region extends from beneath a source contact and/or a source implant region without extending to beneath a drain contact. The p-type conductivity region may also extend from beneath a source contact and/or a source implant region without extending to beneath a drain implant region.

In further embodiments of the present invention, the MESFET is a silicon carbide (SiC) MESFET having a SiC substrate. The p-type conductivity region may be disposed on the SiC substrate. In some embodiments, the p-type conductivity region is in the SiC substrate. The n-type conductivity channel layer may include n-type conductivity SiC and the p-type conductivity region may include p-type conductivity SiC.

In still further embodiments of the present invention, the p-type conductivity region may have a carrier concentration of from about $1.0 \times 10^{18}$ cm$^{-3}$ to about $1.0 \times 10^{20}$ cm$^{-3}$. The n-type conductivity channel layer may include a first n-type conductivity channel layer and a second n-type conductivity channel layer. The first n-type conductivity channel layer may have a carrier concentration of about $3 \times 10^{17}$ cm$^{-3}$ and the second n-type conductivity channel layer may have a carrier concentration of about $1 \times 10^{16}$ cm$^{-3}$. The first n-type conductivity channel layer may have a thickness of about 0.28 µm and the second n-type conductivity channel layer may have a thickness of about 900 Å. In certain embodiments of the present invention, the n-type conductivity channel layer includes first, second and third n-type conductivity channel layers. The first, second and third n-type conductivity channel layers may have respective first, second and third carrier concentrations.

In some embodiments of the present invention, the MESFET may further include a buffer layer on a SiC substrate. The p-type conductivity region may be formed in the buffer layer. The p-type layer may also be formed in the SiC substrate. The p-type layer may extend about 0.4 µm into the buffer layer or the SiC substrate.

In further embodiments of the present invention, the buffer layer may have a thickness of about 2 µm. The buffer layer may include p-type conductivity SiC and may have a carrier concentration of from about $0.5 \times 10^{15}$ cm$^{-3}$ to about $3 \times 10^{15}$ cm$^{-3}$. The buffer layer may also include n-type conductivity SiC and have a carrier concentration of less than about $5 \times 10^{14}$ cm$^{-3}$. Finally, the buffer layer may include undoped SiC.

In still further embodiments of the present invention, the MESFET may be a gallium arsenide (GaAs) MESFET or a Gallium Nitride (GaN) MESFET. The MESFET may have a substrate that may be a GaAs or a GaN substrate. The p-type conductivity region may be disposed on the GaAs or GaN substrate. The n-type conductivity channel layer may include n-type conductivity gallium arsenide (GaAs) or GaN and the p-type conductivity region may include p-type conductivity GaAs or GaN.

In some embodiments of the present invention, the MESFET may further include first and second ohmic contacts on the n-type channel layer that respectively define the source and the drain. A first recess may be provided between the source and the drain that exposes the n-type channel layer. The gate may be disposed in the first recess and extend into the n-type channel layer. A contact via hole may be provided adjacent the source that exposes the p-type conductivity region and a third ohmic contact may be provided on the exposed p-type conductivity region.

In further embodiments of the present invention, a first overlayer may be provided on the second ohmic contact of the drain and a second overlayer may be provided on the first and third ohmic contacts of the source and the exposed portion of the p-type conductivity region, respectively. The second overlayer may electrically couple the first ohmic contact of the source and the third ohmic contact of the exposed portion of the p-type conductivity region.

In still further embodiments of the present invention, the MESFET may further include implanted n-type conductivity regions of SiC in the n-type conductivity channel layer beneath the source and the drain. The implanted n-type conductivity regions of SiC may have carrier concentrations greater than a carrier concentration of the n-type conductivity channel layer. The first and second ohmic contacts are disposed on the n-type conductivity regions of SiC. The implanted n-type conductivity regions of SiC may have carrier concentrations of about $1\times10^{19}$ cm$^{-3}$. The first, second and third ohmic contacts may include nickel contacts.

In certain embodiments of the present invention, a double recessed structure is provided for the gate. A first recess may be provided between the source and the drain that exposes the n-type channel layer. The first recess may have first and second sidewalls. A second recess may be disposed between the first and second sidewalls of the first recess. The gate may be disposed in the second recess and extend into the n-type conductivity channel layer.

In some embodiments of the present invention, a second buffer layer may be provided between the p-type conductivity region and the n-type conductivity channel layer. The second buffer layer may include p-type SiC and may have a carrier concentration of from about $1\times10^{16}$ cm$^{-3}$ to about $5\times10^{16}$ cm$^{-3}$, but is typically about $1.5\times10^{16}$ cm$^{-3}$. The buffer layer may have a thickness of from about 0.5 µm to about 1.0 µm.

In further embodiments of the present invention, the n-type conductivity channel layer and the second buffer layer may form a mesa having sidewalls that define the periphery of the transistor and that extend through the n-type channel layer and the second buffer layer. The sidewalls of the mesa may further extend through the p-type conductivity region into the substrate. An oxide layer may be formed on the n-type conductivity channel layer.

In still further embodiments of the present invention, the gate includes a first gate layer of chromium on the n-type conductivity channel layer. The gate may further include an overlayer on the first gate layer. The overlayer may include platinum and gold. Alternatively, the gate may include a first gate layer of nickel on the n-type conductivity channel layer. The gate may further include an overlayer on the first gate layer. The overlayer may include gold. The gate may also be disposed in a double recessed structure having a floor that extends about 600 Å into the n-type conductivity channel layer. The gate may be from about 0.4 µm to about 0.7 µm long. A distance from the source to the gate may be from about 0.5 µm to about 0.7 µm. A distance from the drain to the gate may be from about 1.5 µm to about 2 µm. In a MESFET including a plurality of unit cells, a distance from a first gate to a second gate may be from about 20 µm to about 50 µm.

In some embodiments a unit cell of a transistor is provided. The unit cell of the transistor has a source, a drain and a gate. The gate of the transistor is between the source and the drain and on a first layer of semiconductor material. A p-type conductivity region is provided beneath the source and has an end that extends towards the drain. The p-type conductivity region is spaced apart from the first layer of semiconductor material and is electrically coupled to the source.

In further embodiments of the present invention, the gate extends into the first layer of semiconductor material. The transistor may include silicon carbide (SiC) transistors, gallium arsenide (GaAs) based transistors, aluminum gallium arsenide (AlGaAs) based transistors, gallium nitride (GaN) based transistors and/or aluminum gallium nitride (AlGaN) based transistors. As used herein, the terms GaN based, AlGaN based, GaAs based or AlGaAs based refer to binary, ternary and quaternary compounds such as GaN, AlGaN and AlInGaN of the respective compounds. For example, a GaN based transistor may include GaN regions, AlGaN regions, InAlGaN regions or the like.

While the present invention is described above primarily with reference to MESFETs, other types of transistors as well as methods of fabricating transistors and, in particular, MESFETs are also provided.

DETAILED DESCRIPTION OF THE INVENTION

Figure 1:
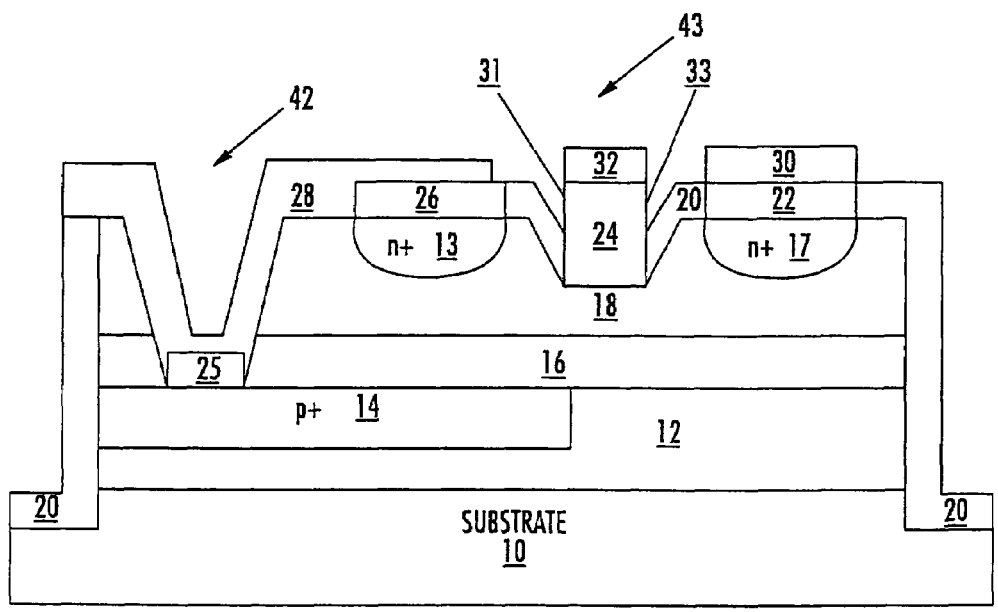
FIG. 1 is a cross-sectional view of a transistor according to embodiments of the present invention.

The present invention will now be described with reference to the FIGS. 1 through 8B, which illustrate various embodiments of the present invention. As illustrated in the Figures, the sizes of layers or regions are exaggerated for illustrative purposes and, thus, are provided to illustrate the general structures of the present invention. Furthermore, various aspects of the present invention are described with reference to a layer being formed on a substrate or other layer. As will be appreciated by those of skill in the art, references to a layer being formed "on" another layer or substrate contemplates that additional layers may intervene. References to a layer being formed on another layer or substrate without an intervening layer are described herein as being formed "directly on" the layer or substrate. Furthermore, relative terms such as beneath may be used herein to describe one layer or regions relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "beneath" is intended to encompass both above and beneath in this situation. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Embodiments of the present invention will now be described in detail below with reference to FIGS. 1 through 8B that illustrate various embodiments of the present invention and various processes of fabricating embodiments of the present invention. A transistor, for example, a metal-semiconductor field effect transistor (MESFET), is provided having p-type conductivity regions beneath the sources of the MESFET having ends that extend towards the drains of the MESFET. As described in detail below, the presence of this p-type conductivity region, for example, p-type conductivity silicon carbide (SiC), may provide, for example, devices having improved breakdown voltages without compromising other performance characteristics of the device. Improved breakdown voltages may be provided because the presence of the p-type conductivity region may inhibit electron injection from the source, which in turn may increase breakdown voltage. Transistors according to embodiments of the present invention may be useful in, for example, high efficiency linear power amplifiers, such as power amplifiers for base stations using complex modulation schemes such as code division multiple access (CDMA) and/or Wideband CDMA (WCDMA).

Referring to FIG. 1, transistors, for example, metal-semiconductor field effect transistors (MESFETs), according to embodiments of the present invention will now be described in detail. As seen in FIG. 1, a substrate 10 is provided. The substrate 10 may be a single crystal bulk silicon carbide (SiC) substrate of either p-type or n-type conductivity or semi-insulating. The substrate 10 of either p-type or n-type may be very lightly doped. The substrate may be formed of silicon carbide selected from the group of 6H, 4H, 15R or 3C silicon carbide. Although the present invention is described herein with reference to a SiC substrate, the present invention should not be limited to SiC. For example, in some embodiments, the substrate 10 may also include, for example, gallium arsenide (GaAs) and/or Gallium Nitride (GaN).

An optional buffer layer 12 of, for example, p-type silicon carbide may be provided on the substrate 10. The buffer layer 12 may be formed of p-type conductivity silicon carbide of 6H, 4H, 15R or 3C polytype. The buffer layer 12 may, for example, have a carrier concentration of from about $0.5 \times 10^{15}$ cm$^{-3}$ to about $3.0 \times 10^{15}$ cm$^{-3}$. Suitable dopants include aluminum, boron and/or gallium. The buffer layer 12 may have a thickness of about 2.0 µm. Although the buffer layer 12 is described above as p-type silicon carbide, the invention should not be limited to this configuration. Alternatively, the buffer layer 12 may be undoped silicon carbide (i.e. not intentionally doped) or very low-doped n-type conductivity silicon carbide. If a very low doped n-type silicon carbide is utilized for the buffer layer 12, the carrier concentration of the buffer layer 12 is preferably less than about $5.0 \times 10^{14}$ cm$^{-3}$.

As further illustrated in FIG. 1, a p$^+$ region 14 is provided beneath a source of the device that has an end that extends towards the drain of the device. As used herein, "p$^+$" or "n$^+$" refer to regions that are defined by higher carrier concentrations than are present in adjacent or other regions of the same or another layer or substrate. In some embodiments of the present invention, the p$^+$ conductivity region 14 may extend from beneath a source contact 26 and/or from beneath an n$^+$ source implant region 13 without extending to beneath an n$^+$ drain implant region 17. In further embodiments of the present invention, the p$^+$ conductivity region 14 may extend from beneath the source contact 26 and/or from beneath the n$^+$ source implant region 13 without extending to beneath a drain contact 22. In still further embodiments, the p$^+$ conductivity region 14 may further extend from beneath the source contact 26 and/or from beneath the n$^+$ source implant region 13 to the first sidewall of the gate 31 without extending past the first sidewall of the gate 31, from beneath the source contact 26 and/or from beneath the n$^+$ source implant region 13 to the second sidewall of the gate 33 without extending past the second sidewall of the gate 33 or from beneath the source contact 26 and/or from beneath the n$^+$ source implant region 13 to a point between the first sidewall 31 and the second sidewall 33 of the gate 24. In certain embodiments of the present invention, the p$^+$ conductivity region 14 may extend to a point within about 0.1 to about 0.3 µm of the first sidewall 31 of the gate 24 on the source side.

Figure 3:
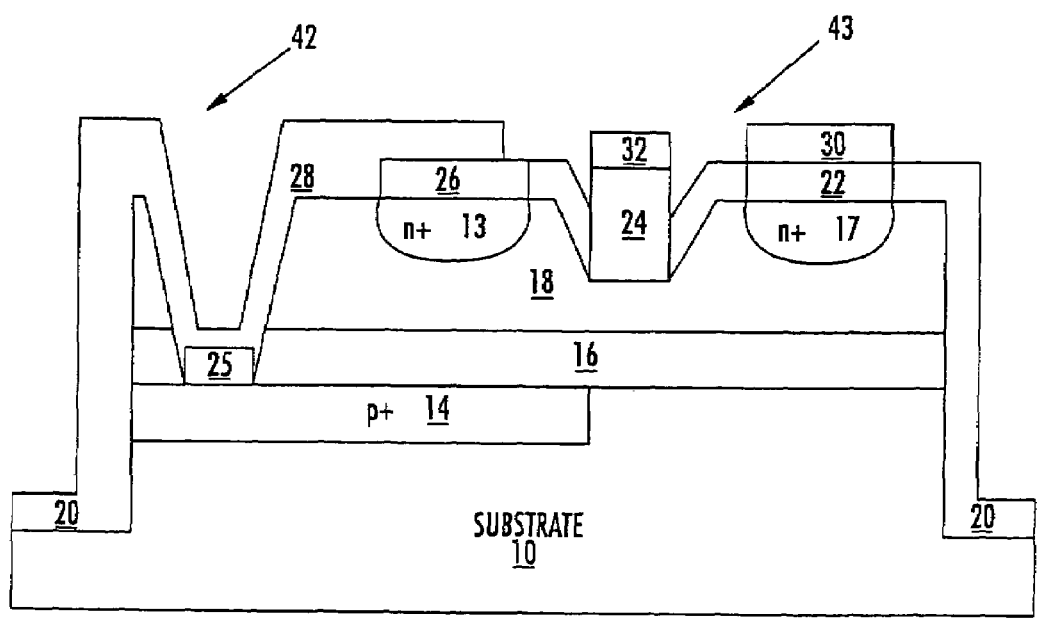
FIG. 3 is a cross-sectional view of a transistor according to further embodiments of the present invention.

The p$^+$ region 14 is a region of p-type conductivity, for example, p-type conductivity silicon carbide. For the p$^+$ region 14, carrier concentrations of from about $1.0 \times 10^{18}$ cm$^{-3}$ to about $1.0 \times 10^{20}$ cm$^{-3}$ may be suitable, but carrier concentrations as high as possible are preferred. The carrier concentration may not be constant throughout the p$^+$ region 14, but it is preferable that the carrier concentration be as high as possible at the surface of the p$^+$ region 14 to facilitate the formation of ohmic contacts thereon. In some embodiments of the present invention, the p$^+$ conductivity region 14 may be provided in the substrate 10 as illustrated in FIG. 3. The p$^+$ conductivity region 14 may, for example, extend about 0.4 µm into the buffer layer 12 or the substrate 10. The presence of the p$^+$ conductivity region 14 beneath the source region may inhibit electron injection from the source, thus, possibly providing an improved breakdown voltage. Furthermore, the fact that the p$^+$ conductivity region 14 does not extend to beneath the drain region may hinder the introduction of parasitics into the device and, thus, device performance may not be influenced.

The buffer layer 12 may be disposed between the substrate 10 and a second buffer layer 16. The second buffer layer 16 may be, for example, p-type silicon carbide having a carrier concentration of from about $1 \times 10^{16}$ cm$^{-3}$ to about $5 \times 10^{16}$ cm$^{-3}$, but typically about $1.5 \times 10^{16}$ cm$^{-3}$. The p-type silicon carbide buffer layer 16 may also have a thickness of from about 0.5 µm to about 1.0 µm. Although the second buffer layer 16 is described above as being of p-type conductivity silicon carbide, it will be understood that the present invention is not limited to this configuration. Alternatively, for example, the second buffer layer 16 may be of n-type conductivity, for example, very lightly doped n-type conductivity SiC or undoped SiC as discussed above with respect to buffer layer 12. In some embodiments of the present invention, the second buffer layer 16 may be provided directly on the substrate 10 as illustrated in FIG. 3.

Figure 4:
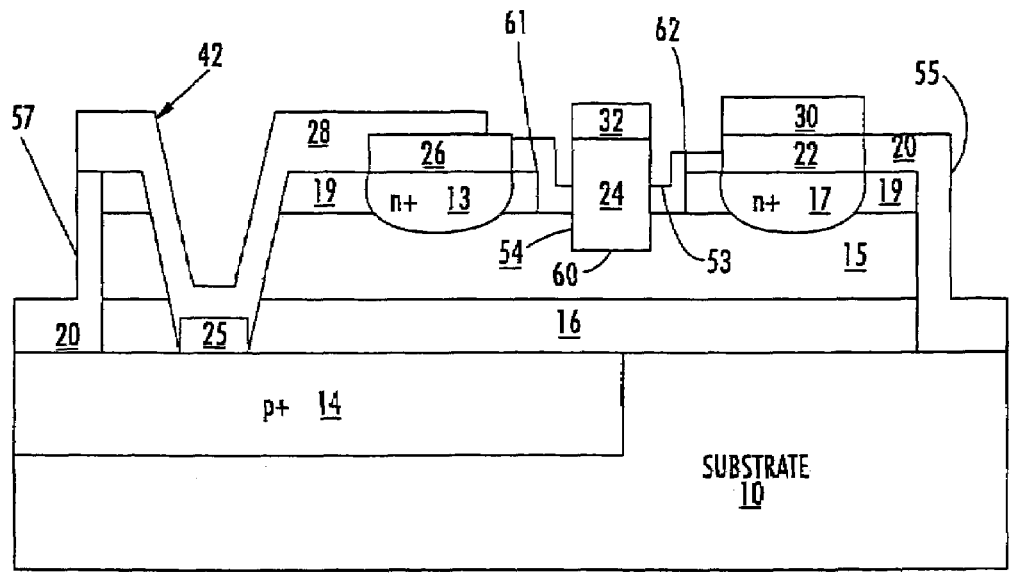
FIG. 4 is a cross-sectional view of a transistor according to further embodiments of the present invention.

An n-type conductivity channel layer 18 is provided on the second buffer layer 16, as illustrated in FIG. 1. The n-type conductivity channel layer 18 may be formed of n-type conductivity silicon carbide of 6H, 4H, 15R or 3C polytype. The n-type conductivity channel layer may include one or more layers of, for example, n-type conductivity silicon carbide having different carrier concentrations. For example, the n-type conductivity channel layer 18 may include a first n-type conductivity channel layer 15 and a second n-type conductivity channel layer 19 as illustrated in FIG. 4. Alternatively, the n-type conductivity channel layer 18 may include first, second and third layers of n-type conductivity SiC as discussed in detail in commonly assigned U.S. patent application Ser. No. 10/136,456 to Sriram, the disclosure of which is incorporated herein by reference as if set forth in its entirety.

As further illustrated in FIG. 1, n$^+$ regions 13 and 17 are provided in the source and drain regions of the device, respectively. Regions 13 and 17 are typically of n-type conductivity silicon carbide and have carrier concentrations that are greater than the carrier concentration of the n-type conductivity channel layer 18. For the n$^+$ regions 13 and 17, carrier concentrations of about $1\times10^{19}$ cm$^{-3}$ may be suitable, but carrier concentrations as high as possible are preferred.

Ohmic contacts 26 and 22 are provided on the implanted regions 13 and 17, respectively, and are spaced apart so as to provide the source contact 26 and the drain contact 22. Ohmic contact 25 is provided on the p$^+$ conductivity region 14 to provide a p$^+$ contact 25. The ohmic contacts 25, 26 and 22 are preferably formed of nickel or other suitable metals. The p$^+$ conductivity region 14 is maintained at the same potential as the source by, for example, electrically coupling the p$^+$ ohmic contact 25 to the source contact 26. An insulator layer 20, such as an oxide, may be further provided on the exposed surface of the device.

Transistors according to certain embodiments of the present invention include a first recess 43 and a contact via hole 42. The first recess 43 is provided between first and second n$^+$ regions 13 and 17, i.e. between the source region and the drain region. The first recess 43 extends into the n-type conductivity channel layer 18 and exposes the n-type conductivity channel layer 18. The contact via hole 42 is provided adjacent the source region 13 and exposes at least a portion of the p$^+$ region 14.

Transistors according to embodiments of the present invention may include a double recessed structure containing first and second recesses as illustrated in FIG. 4. In particular, a first recess 53 has a floor 60 that extends through the first n-type conductivity channel layer 19 to the second n-type channel layer 15. A second recess 54 is provided between the sidewalls 61, 62 of the first recess. A first sidewall 61 of the first recess 53 is between the source 26 and the gate 24 and a second sidewall 62 of the first recess 53 is between the drain 22 and the gate 24. The floor of the second recess 54 extends into the second n-type conductivity channel layer 15, for example, a distance of about 600 Å. The double recessed structure is discussed further in commonly assigned U.S. patent application Ser. No. 10/136,456 to Sriram.

Figure 5:
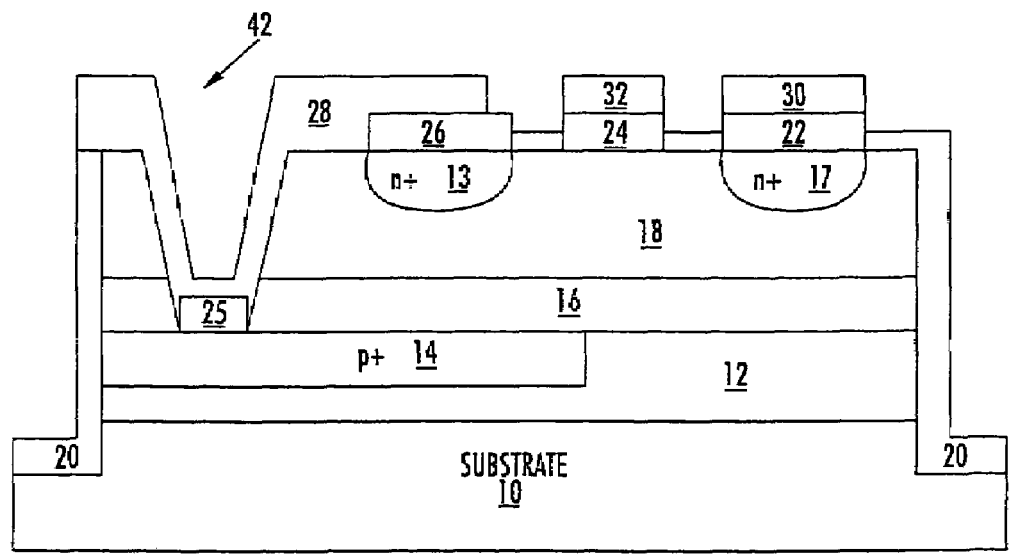
FIG. 5 is a cross-sectional view of a transistor according to further embodiments of the present invention.

Referring again to FIG. 1, the gate contact 24 may be provided in the first recess 43 between the source region 13 and the drain region 17. In embodiments of the present invention having a double recessed structure as discussed above, the gate 24 may be disposed in the second recess 54 as illustrated in FIG. 4. Furthermore, in certain embodiments of the present invention, the gate contact 24 may be disposed on the n-type conductivity channel layer 18 as illustrated in FIG. 5 and may not be provided in, for example, the first recess 43 or the second recess 54.

The gate contact 24 may be formed of chromium, platinum, platinum silicide, nickel, and/or TiWN, however, other metals such as gold, known to one skilled in the art to achieve the Schottky effect, may be used. The Schottky gate contact 24 typically has a three layer structure. Such a structure may have advantages because of the high adhesion of chromium (Cr). For example, the gate contact 24 can optionally include a first gate layer of chromium (Cr) contacting the n-type conductivity channel layer 18. The gate contact 24 may further include an overlayer of platinum (Pt) and gold 32 or other highly conductive metal. Alternatively, the gate contact 24 may include a first layer of nickel in the first recess 43 on the n-type conductivity channel layer 18. The gate contact 24 may further include an overlayer on the first layer of nickel that includes a layer of gold.

As further illustrated in FIG. 1, metal overlayers 28, 30 and 32 may be provided on the source and p$^+$ contacts 26 and 25, the drain contact 22 and the gate contact 24, respectively. The overlayers 28, 30 and 32 may be gold, silver, aluminum, platinum and/or copper. Other suitable highly conductive metals may also be used for the overlayer. Furthermore, the metal overlayer 28 may electrically couple the p$^+$ contact 25 of the p$^+$ region 14 to the source contact 26.

In selecting the dimensions of the MESFET, the width of the gate is defined as the dimension of the gate perpendicular to the flow of current. As shown in the cross-section of FIG. 1, the gate width runs into and out of the page. The length of the gate is the dimension of the gate parallel to the flow of current. As seen in the cross-sectional views of FIG. 1, the gate length is the dimension of the gate 24 that is in contact with the n-type conductivity channel layer 18. For example, the gate length of the MESFET according to certain embodiments of the present invention may be from about 0.4 μm to about 0.7 μm. Another important dimension is the source to gate distance, which is shown in the cross-section of FIG. 1, as the distance from the source contact 26 or n$^+$ region 13, to the gate contact 24. The source to gate distance according to certain embodiments of the present invention may be from about 0.5 μm to about 0.7 μm. Furthermore, the distance from the drain 22 to the gate 24 may be from about 1.5 μm to about 2 μm. Embodiments of the present invention may further include a plurality of unit cells of MESFETs, and the distance from a first gate of the unit cells to a second gate may be, for example, from about 20 μm to about 50 μm.

Figure 2A:
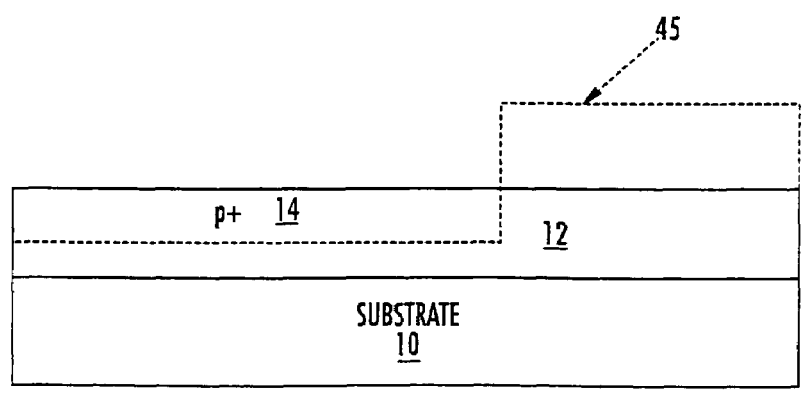
FIGS. 2A through 2H illustrate processing steps in the fabrication of transistors according to embodiments of the present invention.

FIGS. 2A through 2H illustrate the fabrication of FETs according to embodiments of the present invention. As seen in FIG. 2A, an optional buffer layer 12 may be grown or deposited on a substrate 10. The substrate 10 may be a semi-insulating SiC substrate, a p-type substrate or an n-type substrate. The substrate 10 may be very lightly doped. The buffer layer 12 may be of p-type conductivity silicon carbide having a carrier concentration of about $3.0\times10^{15}$ cm$^{-3}$ or less, but typically $1.0\times10^{15}$ cm$^{-3}$ or less. Alternatively, the buffer layer 12 may be n-type silicon carbide or undoped silicon carbide.

If the substrate 10 is semi-insulating it may be fabricated as described in commonly assigned U.S. Pat. No. 6,218,680 to Carter et al. entitled "Semi-insulating Silicon Carbide Without Vanadium Domination", the disclosure of which is hereby incorporated by reference herein as if set forth in its entirety. Such a semi-insulating substrate may be produced by providing silicon carbide substrates with sufficiently high levels of point defects and sufficiently matched levels of p-type and n-type dopants such that the resistivity of the silicon carbide substrate is dominated by the point defects. Such a domination may be accomplished by fabricating the silicon carbide substrate at elevated temperatures with source powders that have concentrations of heavy metals, transition elements or other deep level trapping elements of less than about $1\times10^{16}$ cm$^{-3}$ and preferably less than about $1.0\times10^{14}$ cm$^{-3}$. For example, temperatures between about 2360° C. and 2380° C. with the seed being about 300° C. to about 500° C. lower may be utilized. Thus, it is preferred that the semi-insulating substrate be substantially free of heavy metal, transition element dopants or other deep level trapping elements, such as vanadium, such that the resistivity of the substrate is not dominated by such heavy metals or transition elements. While it is preferred that the semi-insulating substrate be free of such heavy metal, transition element dopants or deep level trapping elements, such elements may be present in measurable amounts while still benefiting from the teachings of the present invention if the presence of such materials does not substantially affect the electrical properties of the MESFETs described herein.

Figure 2B:
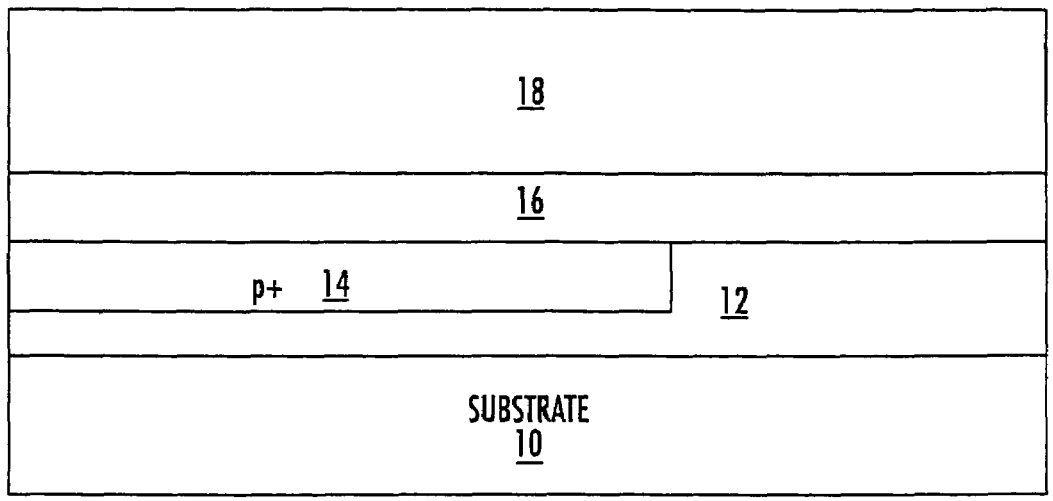

As further illustrated in FIG. 2A, a mask 45 may be formed for implanting the p$^+$ region 14. The p$^+$ region 14 is typically formed by ion implantation of, for example, aluminum, boron and/or gallium, followed by a high temperature anneal. Suitable anneal temperatures may be from about 1300 to about 1600° C., typically about 1500° C. The ion implantation may be performed on the regions that are not covered by the mask 45 to form p$^+$ region 14 as illustrated in FIG. 2B. Thus, the ions are implanted in portions of the buffer layer 12, if present, or the substrate 10, to provide a highly doped region of p-type conductivity, for example, p-type conductivity silicon carbide. Once implanted, the dopants are annealed to activate the implant. The highly doped region of p-type conductivity may extend about 0.4 µm into the buffer layer 12 or the substrate 10.

As seen in FIG. 2B, a second buffer layer 16 and an n-type conductivity channel layer 18 are grown or deposited on the buffer layer 12. It will be understood that if the buffer layer 12 is not included, the second buffer layer 16 and the n-type conductivity channel layer 18 may be grown or deposited on the substrate 10. The second buffer layer 16 is formed on the buffer layer 12 and the n-type conductivity channel layer 18 is formed on the second buffer layer 16 as illustrated in FIG. 2B.

Figure 2C:
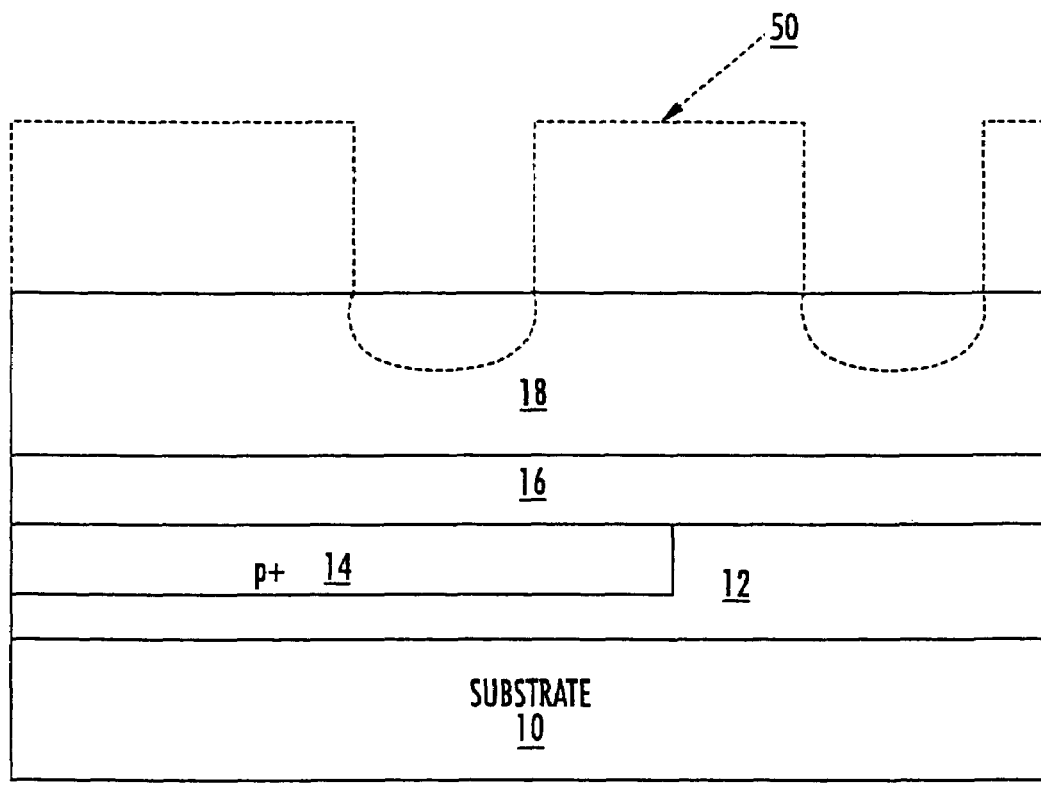
Figure 2D:
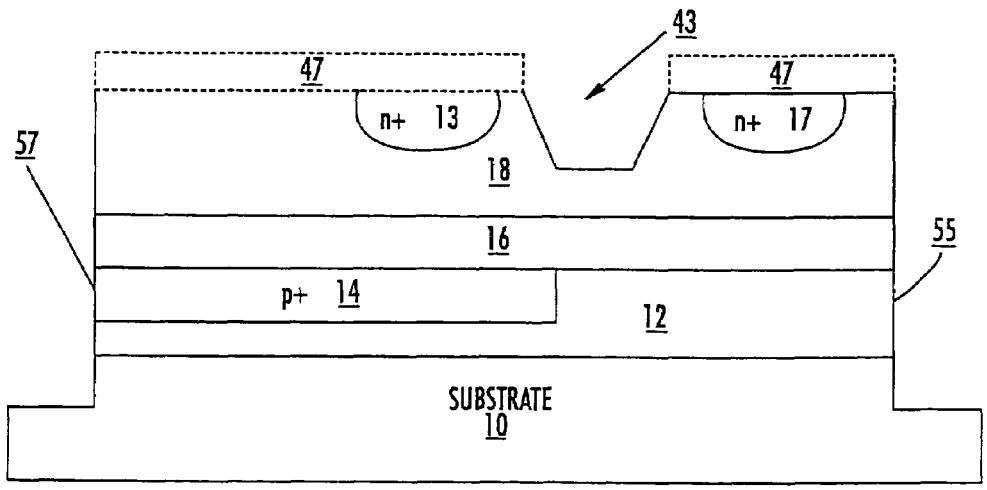

As illustrated in FIG. 2C, a mask 50 may be formed for implanting n$^+$ regions 13 and 17. Regions 13 and 17 are typically formed by ion implantation of, for example, nitrogen (N) or phosphorus (P), followed by a high temperature anneal. Suitable anneal temperatures may be from about 1100 to about 1600° C. The ion implantation may be performed on the regions which are not covered by the mask 50 to form n$^+$ regions 13 and 17 as illustrated in FIG. 2D. Thus, the ions are implanted in portions of the n-type conductivity channel layer 18 to provide highly doped regions of n-type conductivity, for example, n-type conductivity SiC, having higher carrier concentrations than the n-type conductivity channel layer 18. Once implanted, the dopants are annealed to activate the implant.

As seen in FIG. 2D, the substrate 10, the buffer layer 12, the p$^+$ region 14, the second buffer layer 16 and the n-type conductivity channel layer 18 may be etched to form an isolation mesa. The mesa has sidewalls 55, 57 defined by the substrate 10, the buffer layer 12, the p$^+$ region 14, the second buffer layer 16 and the n-type conductivity channel layer 18 that define the periphery of the transistor. The sidewalls of the mesa extend downward past the p$^+$ conductivity region 14. The mesa may be formed to extend into the substrate 10 of the device as shown in FIG. 2D. The mesa may extend past the depletion region of the device to confine current flow in the device to the mesa and reduce the capacitance of the device. The mesa is preferably formed by reactive ion etching the above described device, however, other methods known to one skilled in the art may be used to form the mesa. Furthermore, if a mesa is not utilized the device may be isolated using other methods such as proton bombardment, counterdoping with compensating atoms or other methods known to those skilled in the art.

In certain embodiments, only the second buffer layer 16 and the n-type conductivity channel layer 18 may be etched to form an isolation mesa as shown in FIG. 4. In these embodiments, the sidewalls 55, 57 are defined by the second buffer layer 16 and the n-type conductivity channel layer 18, which define the periphery of the transistor.

FIG. 2D further illustrates the formation of a first recess 43 of the MESFET. The first recess 43 may be formed by forming a mask 47 and then etching through the n-type conductivity channel layer 18 to form the first recess 43 according to the mask 47. The first recess 43 may be formed by an etching process, such as a dry or wet etch process. For example, the first recess 43 may be formed by dry etching, for example, Electron Cyclotron Resonance (ECR) or Inductively Coupled Plasma (ICP) etching. The mask 47 may be removed.

As discussed above, embodiments of the present invention may include a double recessed structure instead of the single recess 43. As illustrated in FIG. 4, a first recess 53 of the double recessed structure may be formed by forming a mask for the first recess 53 and etching through the first n-type conductivity channel layer 19 to form the first recess 53 according to the mask. An insulation layer may be formed after the first recess 53 has been formed. After forming the ohmic contacts as illustrated in FIG. 2G, a second recess 54 of the double recessed structure may be formed by forming a second mask for the second recess and etching the recess according to the mask. The second n-type conductivity channel layer 15 may be etched into a distance of, for example, about 600 Å to form the second recess 54. Methods of fabricating the double recessed structure are discussed further in commonly assigned U.S. patent application Ser. No. 10/136,456 to Sriram.

Figure 2E:
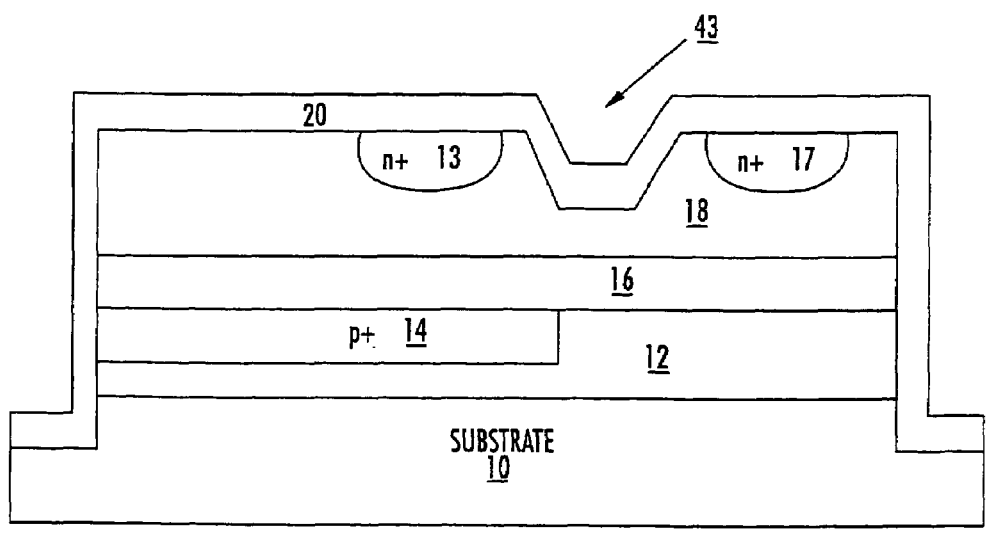

FIG. 2E illustrates the formation of an insulator layer 20, for example, an oxide layer, after the first recess 43 has been formed as discussed above. The insulator layer 20 may be grown or deposited over the exposed surface of the existing structure, i.e. on the isolation mesa, n$^+$ regions 13 and 17, the n-type conductivity channel layer 18 and in the first recess 43. The oxidation process may remove, for example, SiC that may have been damaged by the etch process and may also smooth out roughness that may have been created on the surface by the etch.

Figure 2F:
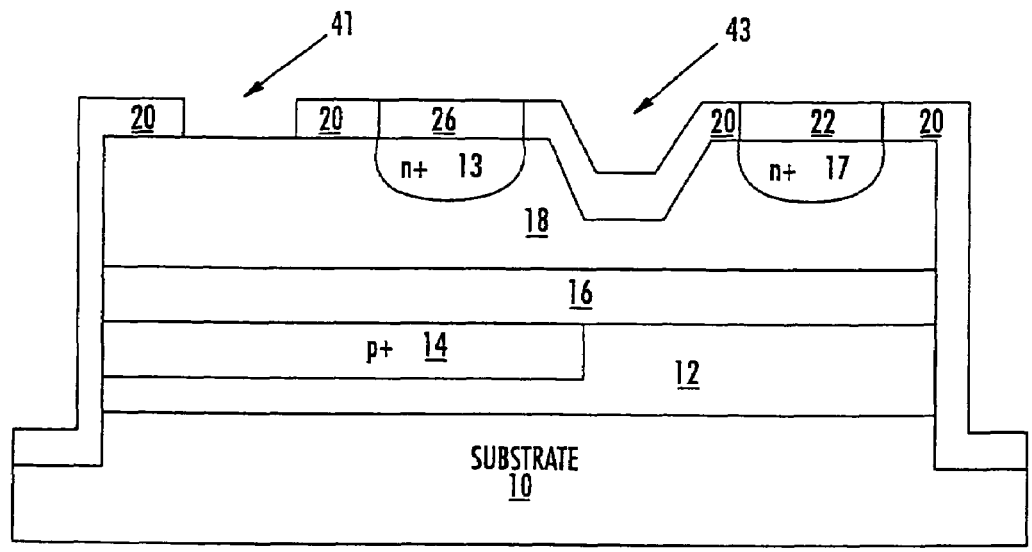
Figure 2G:
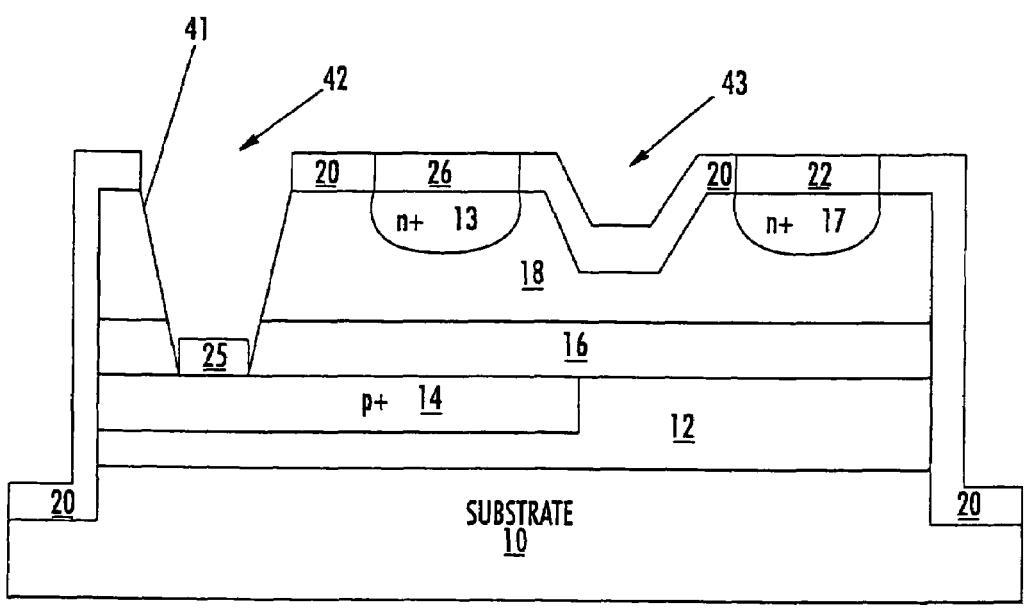

As illustrated in FIG. 2F, contact windows may be etched through the insulator layer 20 to the n$^+$ regions 13 and 17. A third contact window 41 may be etched in the insulator layer 20 above the highly doped p$^+$ region 14. Nickel may then be evaporated to deposit the source and drain contacts 26 and 22, respectively. The nickel may be annealed to form the ohmic contacts 26 and 22 as illustrated in FIG. 2F. Such a deposition and annealing process may be carried out utilizing conventional techniques known to those of skill in the art. For example, the ohmic contacts 26 and 22 may be annealed at a temperature of from about 950° C. to about 1100° C. for about 2 minutes. However, other times and temperatures may also be utilized. Times from about 30 seconds to about 10 minutes may be, for example, acceptable.

As illustrated in FIG. 2G, a contact via hole 42 of the MESFET may be formed. The contact via hole 42 may be etched in the portion of the MESFET defined by window 41 in the insulator layer 20. The n-type conductivity channel layer 18 and the second buffer layer 16 may be etched through to expose the p$^+$ conductivity region 14 to form the contact via hole 42. The etching process may be, for example, a dry or wet etch process. As further illustrated in FIG. 2G, nickel may be evaporated to deposit the p$^+$ contact 25. The nickel may be annealed to form the ohmic contact 25. Such a deposition and annealing process may be carried out utilizing conventional techniques known to those of skill in the art. For example, the ohmic contact 25 may be annealed at a temperature of from about 600° C. to about 1050° C.

Figure 2H:
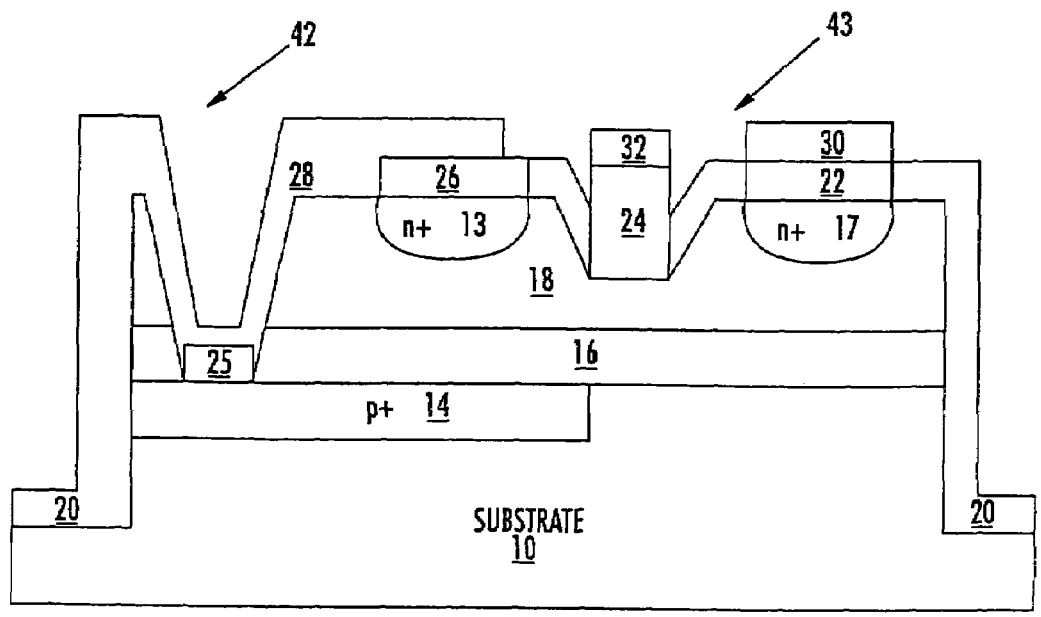

FIG. 2H illustrates the formation of the gate contact 24 and the overlayers 28, 30 and 32. For example, a window may be opened in the insulator 20 and a layer of chromium may be deposited in the first recess 43. Typically, the chromium layer is formed by evaporative deposition. The gate structure may then be completed by deposition of platinum and gold. As will also be appreciated by those of skill in the art, the overlayers 28 and 30 may be formed either before or after formation of the gate structure. In fact, if the titanium/platinum/gold structure is utilized, the platinum and gold portions of the overlayer may be formed in the same processing steps as the platinum and gold portions 32 of the gate structure. Accordingly, the overlayers 28 and 30 may be formed prior to the formation of a gate contact or after the formation of a gate contact. As further illustrated, the source contact 26 and the p$^+$ contact share a single overlayer 28, which electrically couples the source to the highly doped p-type conductivity region 14. Alternatively, as discussed above the first recess 43 may be a double recess structure and the gate may be disposed within the double recessed structure.

Referring now to FIG. 3, a cross-sectional view of a transistor according to further embodiments of the present invention will be discussed. Like numbers refer to like elements in previously described figures, thus, detailed descriptions of these elements will be omitted. As seen in FIG. 3, a substrate 10 is provided. The substrate 10 may be, for example, SiC, GaAs or GaN. A p$^+$ region 14 is provided beneath a source of the device and has an end that extends towards the drain of the device. In some embodiments of the present invention, the p$^+$ conductivity region 14 may extend from beneath the source contact 26 and/or from beneath the n$^+$ source implant region 13 extending to beneath the n$^+$ drain implant region 17. In further embodiments of the present invention, the p$^+$ conductivity region 14 may extend from beneath the source contact 26 and/or from beneath the n$^+$ source implant region 13 without extending to beneath the drain contact 22. In embodiments of the present invention illustrated in FIG. 3, the p$^+$ conductivity region 14 is provided in the substrate 10.

A second buffer layer 16 is provided on the substrate 10 and the p$^+$ conductivity region 14. An n-type conductivity channel layer 18 is provided on the second buffer layer 16. The n$^+$ regions 13 and 17 are provided in the source and drain regions of the device, respectively. Ohmic contacts 26 and 22 are provided on the implanted regions 13 and 17, respectively, and are spaced apart so as to provide the source contact 26 and the drain contact 22. Ohmic contact 25 is provided on the p$^+$ conductivity region 14 to provide a p$^+$ contact 25. The p$^+$ conductivity region 14 is maintained at the same potential as the source by, for example, electrically coupling the p$^+$ ohmic contact 25 to the source contact 26. An insulator layer 20, such as an oxide, is further provided on the exposed surface of the device.

A first recess 43 is provided between first and second n$^+$ regions 13 and 17, i.e. between the source region and the drain region. The first recess 43 extends into the n-type conductivity channel layer 18 and exposes the n-type conductivity channel layer 18. A contact via hole 42 is provided adjacent the source region 13 and exposes at least a portion of the p$^+$ region. The gate contact 24 is provided in the first recess 43 between the source region 13 and the drain region 17. As further illustrated in FIG. 3, metal overlayers 28, 30 and 32 may be provided on the source and p$^+$ contacts 26 and 25, the drain contact 22 and the gate contact 24, respectively. Furthermore, metal overlayer 28 may electrically couple the p$^+$ contact 25 of the p$^+$ region 14 to the source contact 26.

Referring now to FIG. 4, a cross-sectional view of a transistor according to further embodiments of the present invention will be discussed. Like numbers refer to like elements in previously described figures, thus, detailed descriptions of these elements will be omitted. As seen in FIG. 4, a substrate 10 is provided. The substrate 10 may be, for example, SiC, GaAs or GaN. A p$^+$ region 14 is provided beneath a source of the device and has an end that extends toward the drain of the device. In some embodiments of the present invention, the p$^+$ conductivity region 14 may extend from beneath the source contact 26 and/or from beneath the n$^+$ source implant region 13 without extending to beneath the n$^+$ drain implant region 17. In further embodiments of the present invention, the p$^+$ conductivity region 14 may extend from beneath the source contact 26 and/or from beneath the n$^+$ source implant region 13 without extending to beneath the drain contact 22. The p$^+$ conductivity region 14 is provided in the substrate 10. A buffer layer 16 is provided on the substrate 10 and the p$^+$ conductivity region 14. The buffer layer 16 may be, for example, p-type conductivity silicon carbide having a carrier concentration of about $1.5 \times 10^{16}$ cm$^{-3}$ and a thickness of about 0.5 µm.

A first n-type conductivity channel layer 15 is provided on the buffer layer 16. The first n-type conductivity channel layer 15 may have, for example, a carrier concentration of about $3 \times 10^{17}$ cm$^{-3}$ and a thickness of about 0.28 µm. The second n-type conductivity channel layer 19 may be on the first n-type channel layer 15 and may have, for example, a carrier concentration of about $1 \times 10^{16}$ cm$^{-3}$ and a thickness of about 900 Å.

The n$^+$ regions 13 and 17 are provided in the source and drain regions of the device, respectively. Ohmic contacts 26 and 22 are provided on the implanted regions 13 and 17, respectively, and are spaced apart so as to provide the source contact 26 and the drain contact 22. Ohmic contact 25 is provided on the p$^+$ conductivity region 14 to provide a p$^+$ contact 25. The p$^+$ conductivity region 14 is maintained at the same potential as the source by, for example, electrically coupling the p$^+$ ohmic contact 25 to the source contact 26. An insulator layer 20, such as an oxide, is further provided on the exposed surface of the device. The second buffer layer 16, the first n-type conductivity channel layer 15 and the second n-type conductivity layer 19 may be etched to form an isolation mesa. As illustrated, the mesa includes sidewalls 55, 57 that define the periphery of the transistor.

As illustrated in FIG. 4, a double recess in provided in the transistor of FIG. 4. The double recessed structure is provided between first and second n+ regions 13 and 17, i.e. between the source region and the drain region. The first recess 53 has a floor 60 that extends through the second n-type conductivity channel layer 19 to the first n-type conductivity channel layer 15 and exposes the first n-type conductivity channel layer 15. In certain embodiments, the first recess 53 may extend into the first n-type conductivity channel layer 15. The second recess 54 is provided between the sidewalls 61, 62 of the first recess. A first sidewall 61 of the first recess 53 is between the source 26 and the gate 24 and a second sidewall 62 of the first recess 53 is between the drain 22 and the gate 24. The floor of the second recess 54 extends into the second n-type conductivity channel layer 15, for example, a distance of about 600 Å.

A contact via hole 42 is provided adjacent the source region 13 and exposes at least a portion of the p+ region. The gate contact 24 is provided in the second recess 54 between the source region 13 and the drain region 17. As further illustrated in FIG. 4, metal overlayers 28, 30 and 32 may be provided on the source and p+ contacts 26 and 25, the drain contact 22 and the gate contact 24, respectively. Furthermore, metal overlayer 28 may electrically couple the p+ contact 25 of the p+ region 14 to the source contact 26.

Now referring to FIG. 5, a cross-sectional view of a MESFET according to further embodiments of the present invention will be discussed. Like numbers refer to like elements in previously described figures, thus, descriptions of these elements will be omitted. As illustrated in FIG. 5, the gate 24 is disposed on the n-type conductivity channel layer 18 and is not disposed in a single or double recess.

Figure 6:
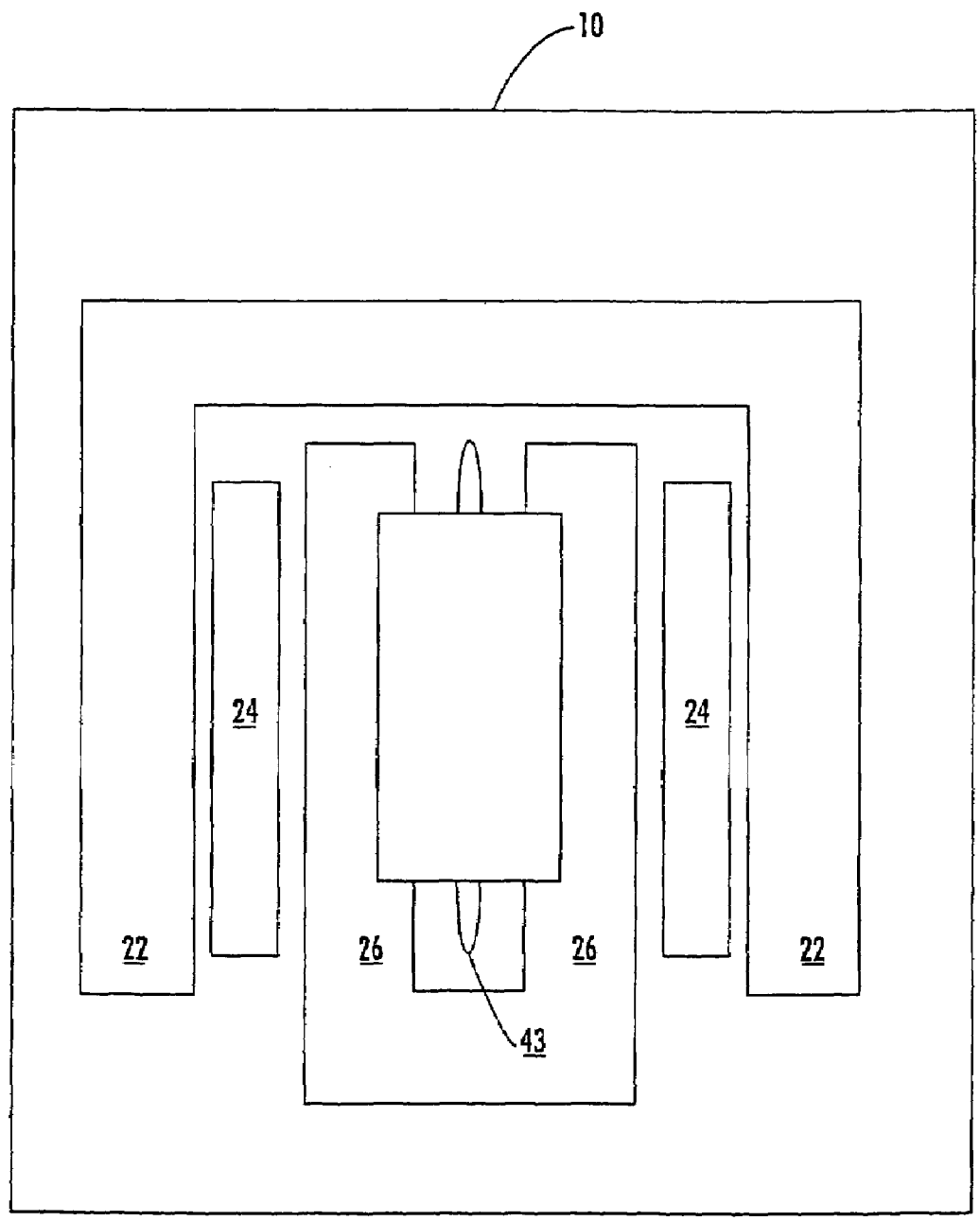
FIG. 6 is a plan view of a transistor according to embodiments of the present invention.

Referring now to FIG. 6, a plan view (top view) of MESFETs according to certain embodiments of the present invention will be described. As illustrated in FIG. 6, a plurality of unit cells are provided on a substrate 10. A gate 24 is situated between a source region 26 and a drain region 22. As illustrated in FIG. 6, the source contacts 26 and drain contacts 22 are interdigitated. An overlayer 28 electrically couples the source region 26 to a p+ region (not shown) via a p+ contact (not shown) that is disposed in the contact via hole 43.

Figure 7A:
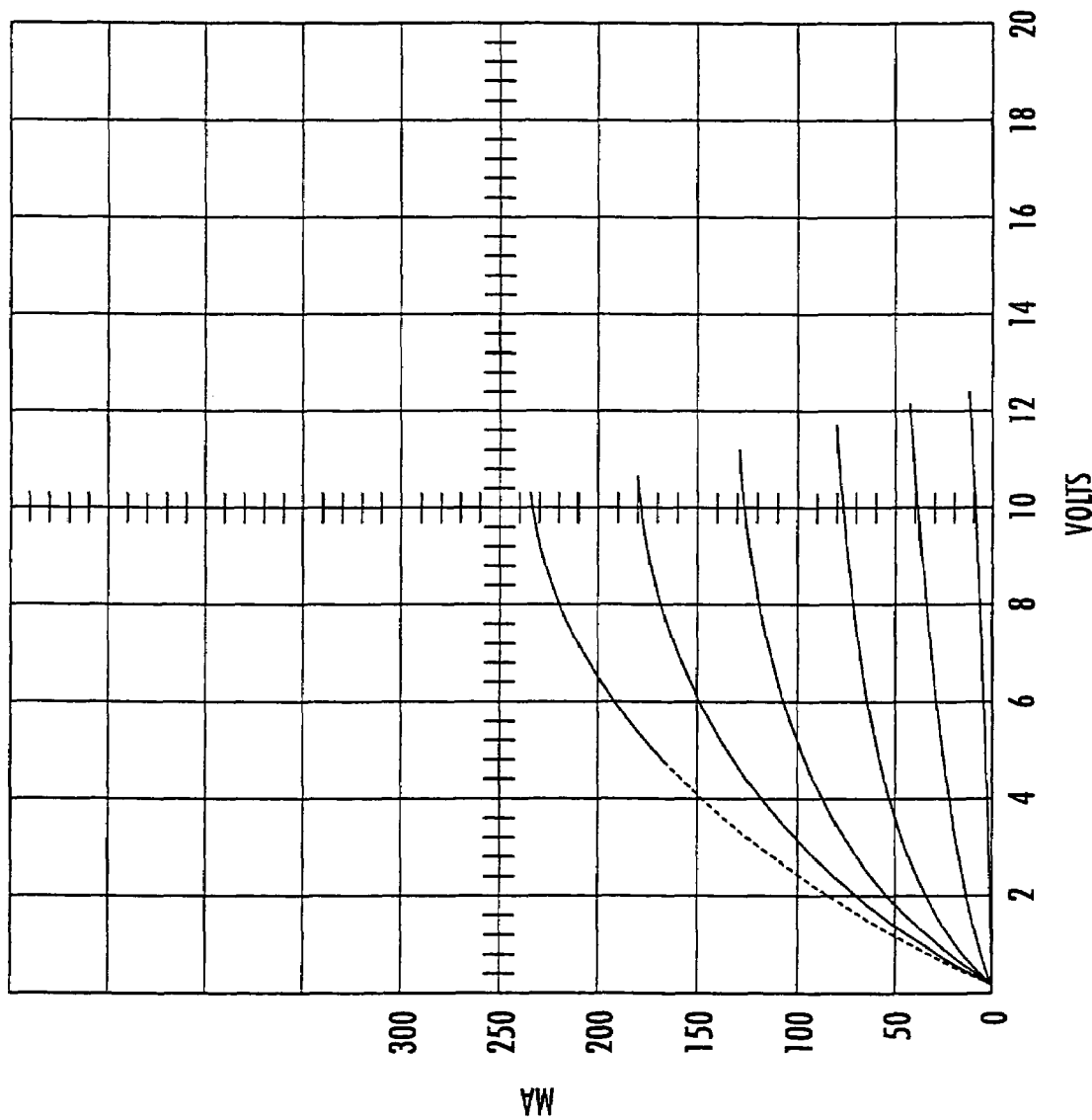
FIGS. 7A and 7B are graphs illustrating the drain current-voltage characteristics of conventional MESFETS.
Figure 7B:
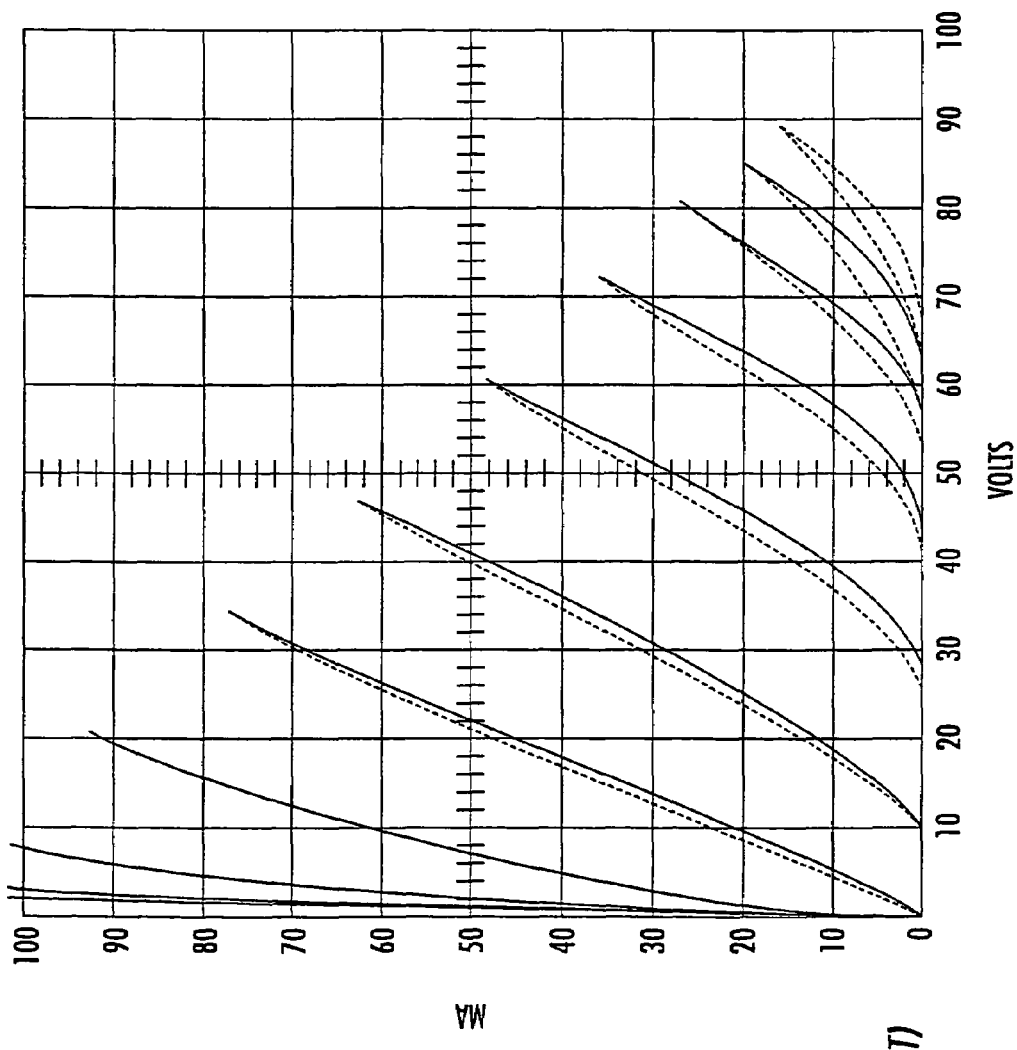
Figure 8A:
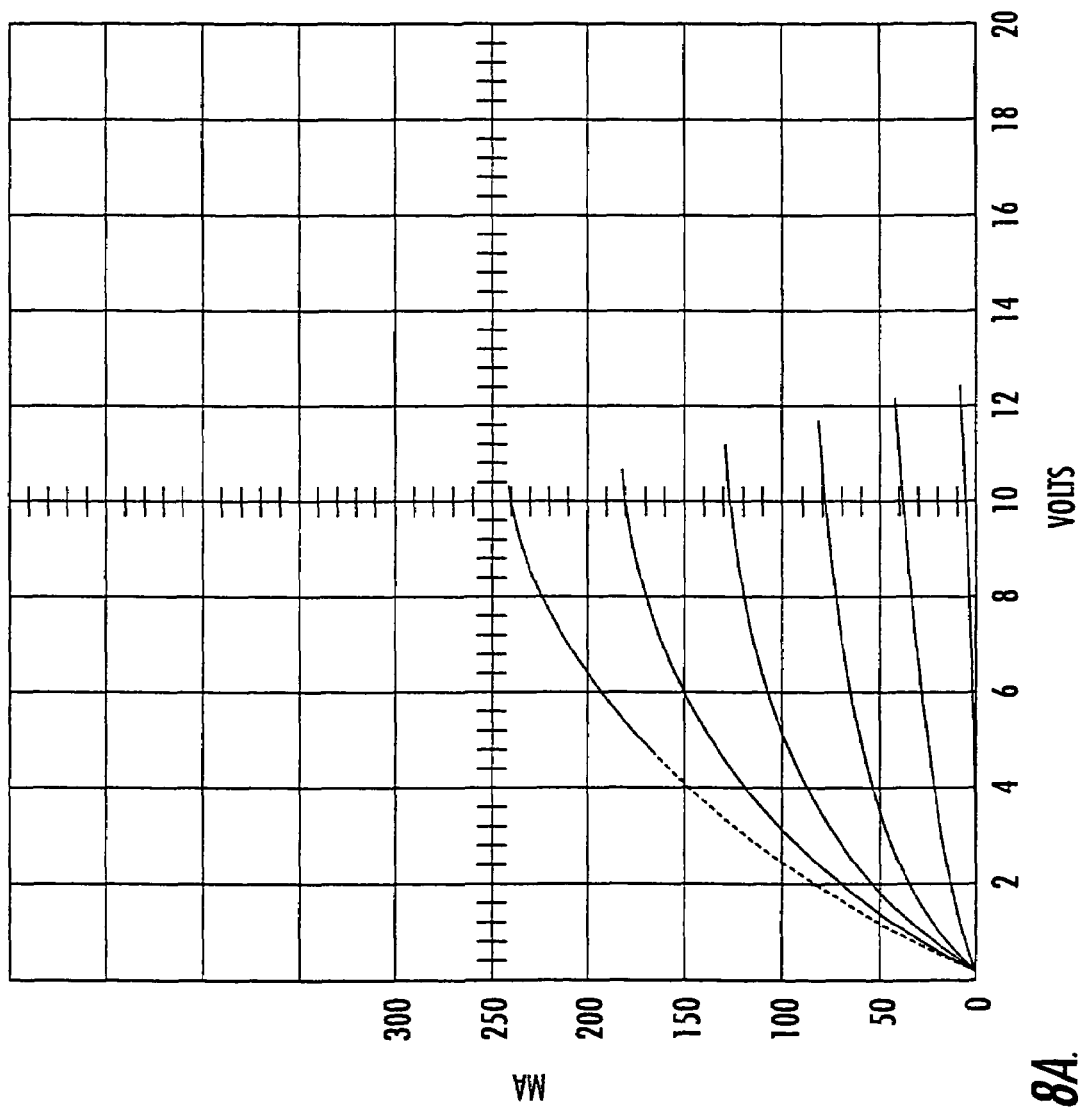
FIGS. 8A and 8B are graphs illustrating the drain current-voltage characteristics of MESFETS according to embodiments of the present invention.
Figure 8B:
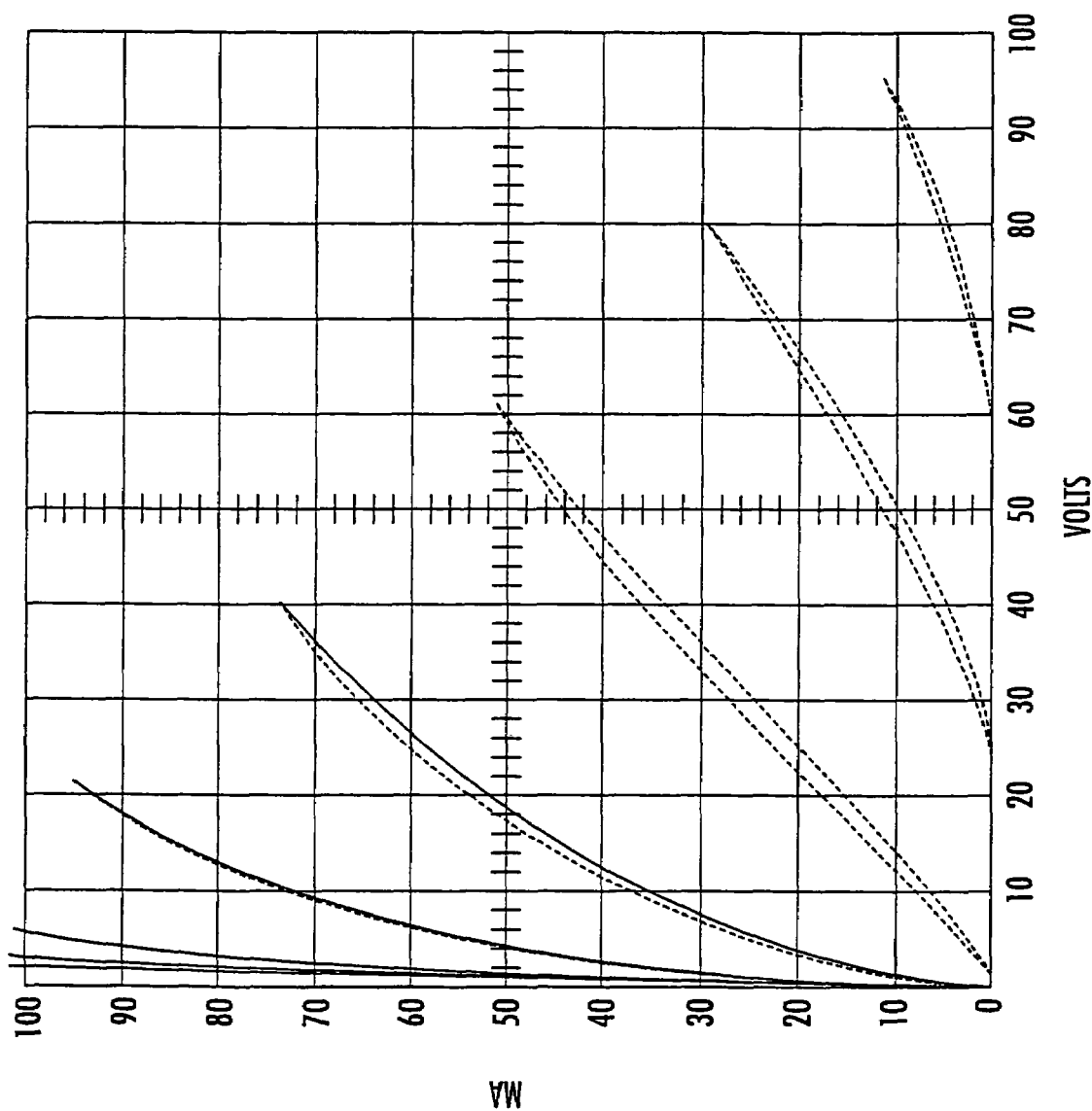

FIGS. 7A and 7B are graphs illustrating the drain current-voltage characteristics of conventional MESFETs at low voltages and high voltages, respectively. FIGS. 8A and 8B are graphs illustrating the drain current-voltage characteristics of MESFETs according to embodiments of the present invention at low voltages and high voltages, respectively. The data illustrated in FIGS. 7A, 7B, 8A and 8B was obtained from a conventional MESFET device and a MESFET device according to embodiments of the present invention that were fabricated on the same wafer. Fabrication of these devices on the same wafer may reduce the number of uncertainties due to variations in wafer properties.

Referring now to FIGS. 7A and 8A, the conventional MESFET and the MESFET according to embodiments of the present invention may have similar characteristics at low drain voltages. However, as illustrated in FIGS. 7B and 8B, at high drain voltages, e.g. drain voltages exceeding 70 volts, the conventional MESFET experiences excessive leakage current and low transconductance (FIG. 7B). These device characteristics may degrade the power output and RF gain of such devices. In contrast, as illustrated in FIG. 8B, MESFETs according to embodiments of the present invention that include the p-type conductivity layer may provide a low leakage current and increased transconductance at high drain voltages.

Although the present invention is described above with respect to particular MESFETs having particular layers, regions and recesses, it will be understood that embodiments of the present invention are not limited to the above described MESFETs. A p-type conductivity region beneath the source region of according to embodiments of the present invention may be incorporated in to other types of transistors. For example, the p-type conductivity region according to embodiments of the present invention may be incorporated into MESFETs described in commonly assigned U.S. patent application Ser. No. 09/567,717 entitled *Silicon Carbide Metal Semiconductor Field Effect Transistors* to Allen et al., the disclosure of which is hereby incorporated herein by reference as if set forth in its entirety.

As is briefly described above, transistors according to embodiments of the present invention provide a p-type conductivity region beneath the source region of the transistor having an end that extends towards the drain region of the transistor. The presence of this p-type conductivity region may provide, for example, devices having improved breakdown voltages without compromising other performance characteristics of the device because the p-type conductivity region may inhibit electron injection from the source. This may provide an advantage over conventional field effect transistors that may sacrifice device performance characteristics to obtain a high breakdown voltage.

Although the present invention is described above with reference to SiC MESFETs, the present invention is not limited to SiC MESFETs. For example, MESFETs according to embodiments of the present invention may be, for example, gallium arsenide (GaAs) MESFETs or Gallium Nitride (GaN) MESFETs. In particular, if the present invention were described with respect to GaAs MESFETs, the p-type conductivity regions might be p-type conductivity GaAs regions, the n-type conductivity channel layers might be n-type conductivity GaAs layers and the like.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a silicon carbide (SiC) metal-semiconductor field-effect transistor (MESFET), comprising:
    forming a SiC MESFET having a source, a drain and a gate on a SiC substrate, the gate being between the source and the drain and on an n-type conductivity SiC channel layer; and
    forming a p-type conductivity SiC region beneath the source and having an end that extends towards the drain, the p-type conductivity SiC region being spaced apart from the n-type conductivity SiC channel layer and being electrically coupled to the source.

2. The method according to claim 1, wherein forming the gate comprises forming the gate extending into the n-type conductivity channel region.

3. The method of claim 1, wherein the gate has a first sidewall and a second sidewall, the first sidewall being on the source side of the gate and the second sidewall being on the drain side of the gate; and
    wherein forming the p-type conductivity region comprises forming the p-type conductivity region extending from beneath the source to the first sidewall of the gate without extending past the first sidewall of the gate.

4. The method of claim 1, wherein the gate has a first sidewall and a second sidewall, the first sidewall being on the source side of the gate and the second sidewall being on the drain side of the gate; and
   wherein forming the p-type conductivity region comprises forming the p-type conductivity region extending from beneath the source to within about 0.1 to about 0.3 μm of the first sidewall of the gate on the source side of the first sidewall.

5. The method of claim 1, wherein the gate has a first sidewall and a second sidewall, the first sidewall being on the source side of the gate and the second sidewall being on the drain side of the gate; and
   wherein forming the p-type conductivity region comprises forming the p-type conductivity region extending from beneath the source to the second sidewall of the gate without extending past the second sidewall of the gate.

6. The method of claim 1, wherein the gate has a first sidewall and a second sidewall, the first sidewall being on the source side of the gate and the second sidewall being on the drain side of the gate; and
   wherein forming the p-type conductivity region comprises forming the p-type conductivity region extending from beneath the source to between the first and second sidewalls of the gate.

7. The method of claim 1, wherein forming the p-type conductivity region comprises forming the p-type conductivity region extending from beneath a source contact and/or a source implant region without extending to beneath a drain contact.

8. The method of claim 1, wherein forming the p-type conductivity region comprises forming the p-type conductivity region extending from beneath a source contact and/or a source implant region without extending to beneath a drain implant region.

9. The method of claim 1, wherein forming the p-type conductivity SiC region comprises forming the p-type conductivity SiC region on the SiC substrate.

10. The method of claim 9, further comprising forming a buffer layer on the SiC substrate, the buffer layer disposed between the SiC substrate and the n-type conductivity channel layer.

11. The method of claim 10, wherein forming the p-type conductivity region comprises:
    implanting p-type dopants in the buffer layer; and
    annealing the p-type dopants to activate the p-type dopants.

12. The method of claim 10, wherein forming the buffer layer comprises at least one of forming a p-type conductivity SiC layer, forming an n-type conductivity SiC layer and forming an undoped SiC layer.

13. The method of claim 10, wherein forming the buffer layer comprises at least one of growing the buffer layer and depositing the buffer layer.

14. A method of forming a metal-semiconductor field-effect transistor (MESFET), comprising:
    forming a MESFET having a source, a drain and a gate, the gate being between the source and the drain and on an n-type conductivity channel layer;
    forming a p-type conductivity region beneath the source and having an end that extends towards the drain, the p-type conductivity region being spaced apart from the n-type conductivity channel layer and being electrically coupled to the source; and
    forming a silicon carbide (SiC) substrate,
    wherein forming the p-type conductivity region comprises forming the p-type conductivity region on the SiC substrate,
    wherein the n-type conductivity channel layer comprises n-type conductivity SiC,
    wherein the p-type conductivity region comprises p-type conductivity SiC and
    wherein forming the n-type conductivity channel layer comprises:
      forming a first n-type conductivity channel layer on the SiC substrate, the first n-type conductivity channel layer having a first carrier concentration; and
      forming a second n-type conductivity channel layer on the first n-type conductivity channel layer, wherein the second n-type conductivity channel layer has a second carrier concentration that is less than the first carrier concentration of the first n-type conductivity channel layer.

15. The method of claim 14, wherein the first carrier concentration is about $3 \times 10^{17}$ cm$^{-3}$ and wherein the second carrier concentration is about $1 \times 10^{16}$ cm$^{-3}$.

16. The method of claim 14, wherein forming the region of p-type conductivity SiC comprises implanting p-type dopants in the SiC substrate.

17. The method of claim 16, wherein implanting p-type dopants further comprises annealing the p-type dopants to activate the p-type dopants.

18. A method of forming a metal-semiconductor field-effect transistor (MESFET), comprising:
    forming a MESFET having a source, a drain and a gate, the gate being between the source and the drain and on an n-type conductivity channel layer;
    forming a p-type conductivity region beneath the source and having an end that extends towards the drain, the p-type conductivity region being spaced apart from the n-type conductivity channel layer and being electrically coupled to the source; and
    forming a silicon carbide (SiC) substrate,
    wherein forming the p-type conductivity region comprises forming the p-type conductivity region on the SiC substrate,
    wherein the n-type conductivity channel layer comprises n-type conductivity SiC,
    wherein the p-type conductivity region comprises p-type conductivity SiC and
    wherein forming the n-type conductivity layer comprises:
      forming a first n-type conductivity channel layer having a first carrier concentration on a SiC substrate;
      forming a second n-type conductivity channel layer having a second carrier concentration on the first n-type conductivity channel layer; and
      forming a third n-type conductivity channel layer having a third carrier concentration on the second n-type conductivity channel layer.

19. A method of forming a metal-semiconductor field-effect transistor (MESFET), comprising:
    forming a MESFET having a source, a drain and a gate, the gate being between the source and the drain and on an n-type conductivity channel layer;
    forming a p-type conductivity region beneath the source and having an end that extends towards the drain, the p-type conductivity region being spaced apart from the n-type conductivity channel layer and being electrically coupled to the source;

forming a first recess between the source and the drain that exposes the n-type conductivity channel layer, the gate being disposed in the first recess and extending into the n-type conductivity channel layer;

forming an oxide layer on the n-type conductivity channel layer and in the first recess;

forming first and second ohmic contacts on the n-type channel layer that respectively define the source and the drain;

forming a contact via hole adjacent the source that exposes the p-type conductivity region; and forming a third ohmic contact on the exposed p-type conductivity region.

20. The method of claim 19, wherein forming the first recess comprises:

forming a mask for the first recess on the n-type conductivity channel layer; and etching into the n-type conductivity channel layer according to the mask.

21. The method of claim 19, wherein forming the contact via hole comprises:

etching a contact window for the contact via hole in the oxide layer adjacent the p-type conductivity layer; and etching into the n-type conductivity channel layer and a second buffer layer through the contact window to expose the p-type conductivity layer.

22. The method of claim 19, wherein forming the oxide layer comprises growing an oxide layer on the MESFET.

23. The method of claim 19, wherein forming the oxide layer comprises depositing the oxide layer on the MESFET.

24. The method of claim 19, wherein forming first, second and third ohmic contacts comprises:

etching contact windows through the oxide layer adjacent the source, the drain and the p-type conductivity region; and forming the first and second ohmic contacts in the in the contact windows adjacent the source and the drain;

etching into the n-type conductivity channel layer and a second buffer layer through the contact window to expose the p-type conductivity layer; and forming the third ohmic contact on the exposed p-type conductivity layer.

25. The method of claim 24, wherein the first, second and third ohmic contacts comprise nickel.

26. The method of claim 19, further comprising:

forming a first overlayer on the second ohmic contact of the drain; and forming a second overlayer on the first and third ohmic contacts of the source and the exposed portion of the p-type conductivity region, respectively, wherein the second overlayer electrically couples the first ohmic contact on the source to the third ohmic contact of the exposed portion of the p-type conductivity region.

27. The method of claim 19, further comprising:

implanting n-type dopants in regions of SiC in the n-type conductivity channel layer beneath the source and the drain so as to provide highly doped regions of n-type conductivity SiC having higher carrier concentrations than the n-type conductivity channel layer;

wherein forming the first and second ohmic contacts comprises forming the first and second ohmic contacts on the highly doped regions.

28. The method of claim 27, wherein implanting n-type dopants further comprises annealing the n-type dopants to activate the n-type dopants.

29. A method of forming a metal-semiconductor field-effect transistor (MESFET), comprising:

forming a MESFET having a source, a drain and a gate, the gate being between the source and the drain and on an n-type conductivity channel layer;

forming a p-type conductivity region beneath the source and having an end that extends towards the drain, the p-type conductivity region being spaced apart from the n-type conductivity channel layer and being electrically coupled to the source;

forming first and second ohmic contacts on the n-type channel layer that respectively define the source and the drain;

forming a first recess between the source and the drain that exposes the n-type channel layer, the first recess having first and second sidewalls;

forming a second recess between the first and second sidewalls of the first recess, the gate being disposed in the second recess and extending into the n-type conductivity channel layer;

forming a contact via hole adjacent the source that exposes the p-type conductivity region; and forming a third ohmic contact on the exposed p-type conductivity region.

30. The method of claim 29, wherein forming the n-type conductivity channel layer comprises forming first and second n-type conductivity channel layers, wherein forming the first recess comprises forming the first recess extending through the first n-type conductivity channel layer to the second n-type conductivity channel layer so that the second n-type conductivity channel layer is exposed and wherein forming the second recess comprises forming the second recess extending into the second n-type conductivity region.

31. The method of claim 30, wherein forming the second recess further comprises forming the second recess extending about 600 Å into the n-type conductivity region.

32. A method of forming a metal-semiconductor field-effect transistor (MESFET), comprising:

forming a MESFET having a source, a drain and a gate, the gate being between the source and the drain and on an n-type conductivity channel layer;

forming a p-type conductivity region beneath the source and having an end that extends towards the drain, the p-type conductivity region being spaced apart from the n-type conductivity channel layer and being electrically coupled to the source; and forming a second buffer layer between the p-type conductivity region and the n-type conductivity channel layer.

33. The method of claim 32, wherein forming the second buffer layer comprises growing the second buffer layer on the p-type conductivity region.

34. The method of claim 32, wherein forming the second buffer layer comprises depositing the second buffer layer on the p-type conductivity region.

35. The method of claim 32, further comprising etching the n-type conductivity channel layer and the second buffer layer to form a mesa having sidewalls that define the periphery of the transistor.

36. A method of forming a MESFET, comprising:

forming a mask for a p-type conductivity implant on the SiC substrate;

implanting the p-type conductivity implant and activating the p-type conductivity implant with an anneal to provide a p-type conductivity SiC region such that the p-type conductivity SiC region is beneath a source and has an end that extends towards a drain, the p-type conductivity SiC region being spaced apart from an n-type conductivity SiC channel layer and electrically coupled to the source, wherein the n-type conductivity SiC channel layer comprises a first n-type conductivity SiC channel layer and a second n-type conductivity SiC channel layer;

forming a buffer layer on the SiC substrate and the p-type conductivity SiC region;

forming the first n-type conductivity SiC channel layer on the buffer layer;

forming the second n-type conductivity SiC channel layer on the first n-type conductivity SiC channel layer;

forming a mask for an n-type conductivity SiC implant;

implanting the n-type conductivity SiC and activating the n-type conductivity SiC with an anneal to define respective source and drain regions in the second n-type conductivity SiC channel layer;

etching the first and second n-type conductivity SiC channel layers and the buffer layer to form a mesa;

forming a mask for a first recess and etching the first recess between the source region and the drain region, the first recess exposing the first n-type conductivity SiC channel layer and the first recess having first and second sidewalls;

forming an oxide layer on the first and second n-type conductivity SiC channel layers, on the source and drain regions and in the first recess;

opening windows for the source, the drain and a p-type conductivity SiC contact in the oxide layer;

forming first and second ohmic contacts in the windows opened for the source and drain;

forming a mask for a second recess and etching the second recess between the first and second sidewalls of the first recess into the second n-type conductivity SiC channel layer;

etching through the first and second n-type conductivity channel layers and a second buffer layer through the contact window for the p-type conductivity SiC contact to expose the p-type conductivity SiC region;

forming a third ohmic contact on the exposed p-type conductivity SiC region;

forming a gate in the second recess; and forming overlayers on the ohmic contacts and the gate, wherein the source and the exposed portion of the p-type conductivity SiC region share a single overlayer that electrically connects the source and the p-type conductivity SiC region.

* * * * *